US010256206B2

(12) United States Patent
Falcon et al.

(10) Patent No.: US 10,256,206 B2
(45) Date of Patent: Apr. 9, 2019

(54) QUBIT DIE ATTACHMENT USING PREFORMS

(71) Applicant: Intel Corporation, Santa Clara, CA (US)

(72) Inventors: Javier A. Falcon, Chandler, AZ (US); Ye Seul Nam, Chandler, AZ (US); Adel A. Elsherbini, Chandler, AZ (US); Roman Caudillo, Portland, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/923,346

(22) Filed: Mar. 16, 2018

(65) Prior Publication Data

US 2019/0043822 A1 Feb. 7, 2019

(51) Int. Cl.
*H01L 23/00* (2006.01)
*H01L 39/04* (2006.01)
*H01L 23/16* (2006.01)

(52) U.S. Cl.
CPC .............. *H01L 24/32* (2013.01); *H01L 23/16* (2013.01); *H01L 24/83* (2013.01); *H01L 39/045* (2013.01); *H01L 2224/29109* (2013.01); *H01L 2224/29147* (2013.01); *H01L 2224/32052* (2013.01); *H01L 2224/32055* (2013.01); *H01L 2924/014* (2013.01); *H01L 2924/01049* (2013.01)

(58) Field of Classification Search
CPC ....... H01L 24/32; H01L 24/83; H01L 39/045; H01L 23/16
See application file for complete search history.

(56) References Cited

U.S. PATENT DOCUMENTS

| 2014/0246763 | A1* | 9/2014 | Bunyk ..................... | H01L 27/18 257/663 |
| 2015/0357550 | A1* | 12/2015 | Schoelkopf, III ...... | H01L 39/14 257/31 |
| 2016/0364653 | A1* | 12/2016 | Chow .................. | G06N 99/002 |

OTHER PUBLICATIONS

PCT/US2016/068629, Dec. 27, 2016, Flip-Chip Assembly of Qubits.
PCT/US2017/051950, Sep. 18, 2017, Substrate Engineering for Qubits
U.S. Appl. No. 15/899,918, filed Feb. 20, 2018, Superconducting layer for quantum substrates.
"Independent, extensible control of same-frequency superconducting qubits by selective broadcasting," Asaad et al., Netherlands Organisation for Applied Scientific Research, Aug. 28, 2015, 17 pages.

(Continued)

*Primary Examiner* — Anthony Ho
(74) *Attorney, Agent, or Firm* — Patent Capital Group

(57) ABSTRACT

Embodiments of the present disclosure describe novel qubit device packages, as well as related computing devices and methods. In one embodiment, an exemplary qubit device package includes a qubit die and a package substrate, where the qubit die is coupled to the package substrate using one or more preforms. In particular, a single preform may advantageously be used to replace a plurality of individual contacts, e.g. a plurality of individual solder bumps, electrically coupling the qubit die to the package substrate. Such packages may reduce design complexity and undesired coupling, and enable inclusion of larger numbers of qubits in a single qubit die.

20 Claims, 9 Drawing Sheets

(56) References Cited

OTHER PUBLICATIONS

"Multilayer microwave integrated quantum circuits for scalable quantum computing," Brecht et al, Department of Applied Physics, Yale University, Sep. 4, 2015, 5 pages.
"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.
"Surface loss simulations of superconducting coplanar waveguide resonators," Wenner et al, Applied Physics Letters 99, 113513 (2011), pp. 113513-1 through 3.
"Magnetic field tuning of coplanar waveguide resonators," Healey, et al., Applied Physics Letters 93, 043513 (2008), pp. 043513-1 through 3 (4 pages with cover sheet).
"Embracing the quantum limit in silicon computing," Morton et al, Macmillan Publishers, Nov. 17, 2011, vol. 479, Nature, pp. 345-353.
"Scalable quantum circuit and control for a superconducting surface code," Versluis et al, Netherlands Organisation for Applied Scientific Research, Dec. 28, 2016, 9 pages.
"Suspending superconducting qubits by silicon micromachining," Chu et al., Department of Applied Physics, Yale University, Jun. 10, 2016, 10 pages.
Indium Corporation manufactures materials for cryogenic seals and sealing applications, retrieved from the internet on Jan. 30, 2018, http://www.indium.com/engineered-solder-and-alloys/cryogenic-seals/, 2 pages.
Solder Preforms manufactured by Indium, retrieved from the internet on Jan. 30, 2018, http://www.indium.com/solder/preforms, 3 pages.

\* cited by examiner

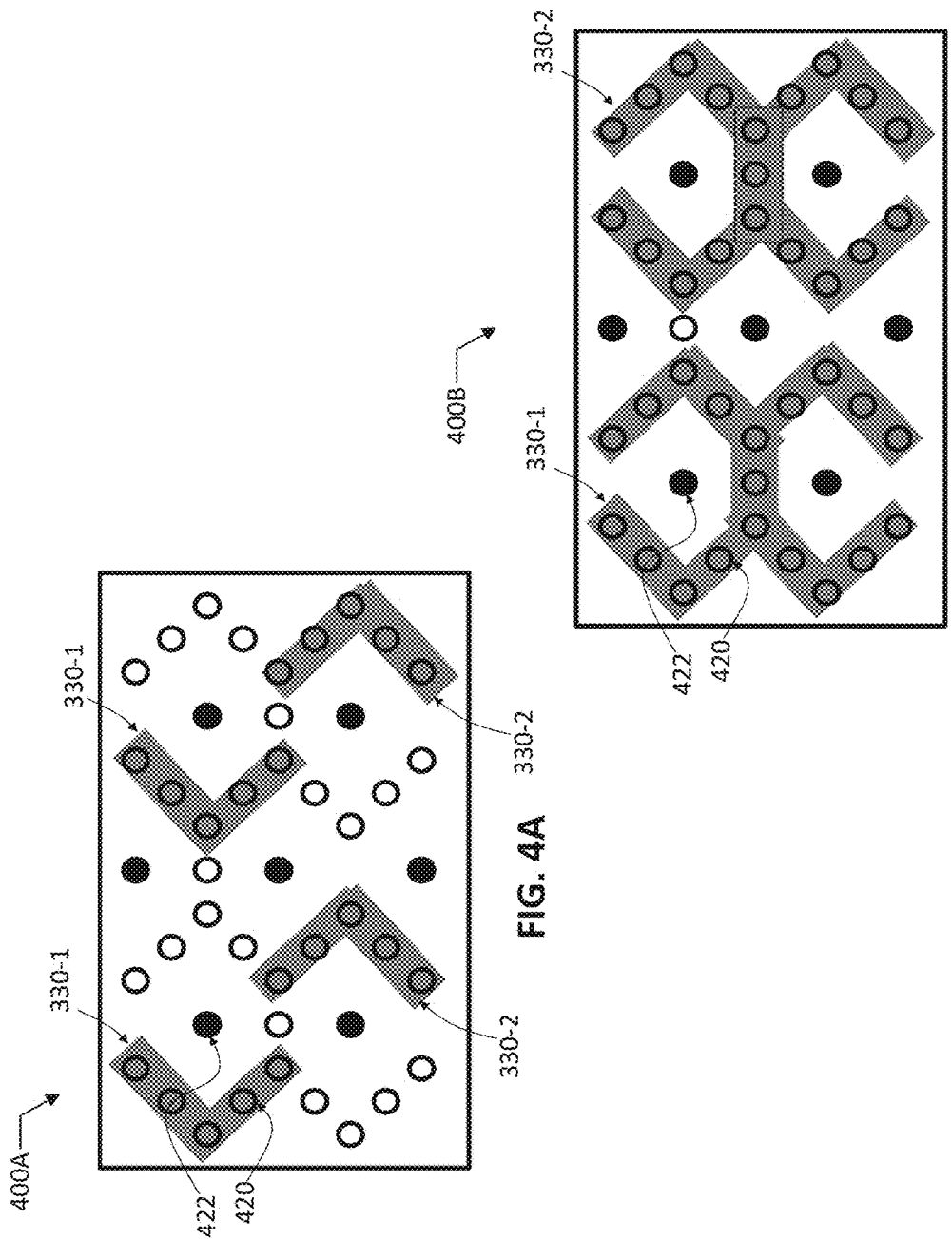

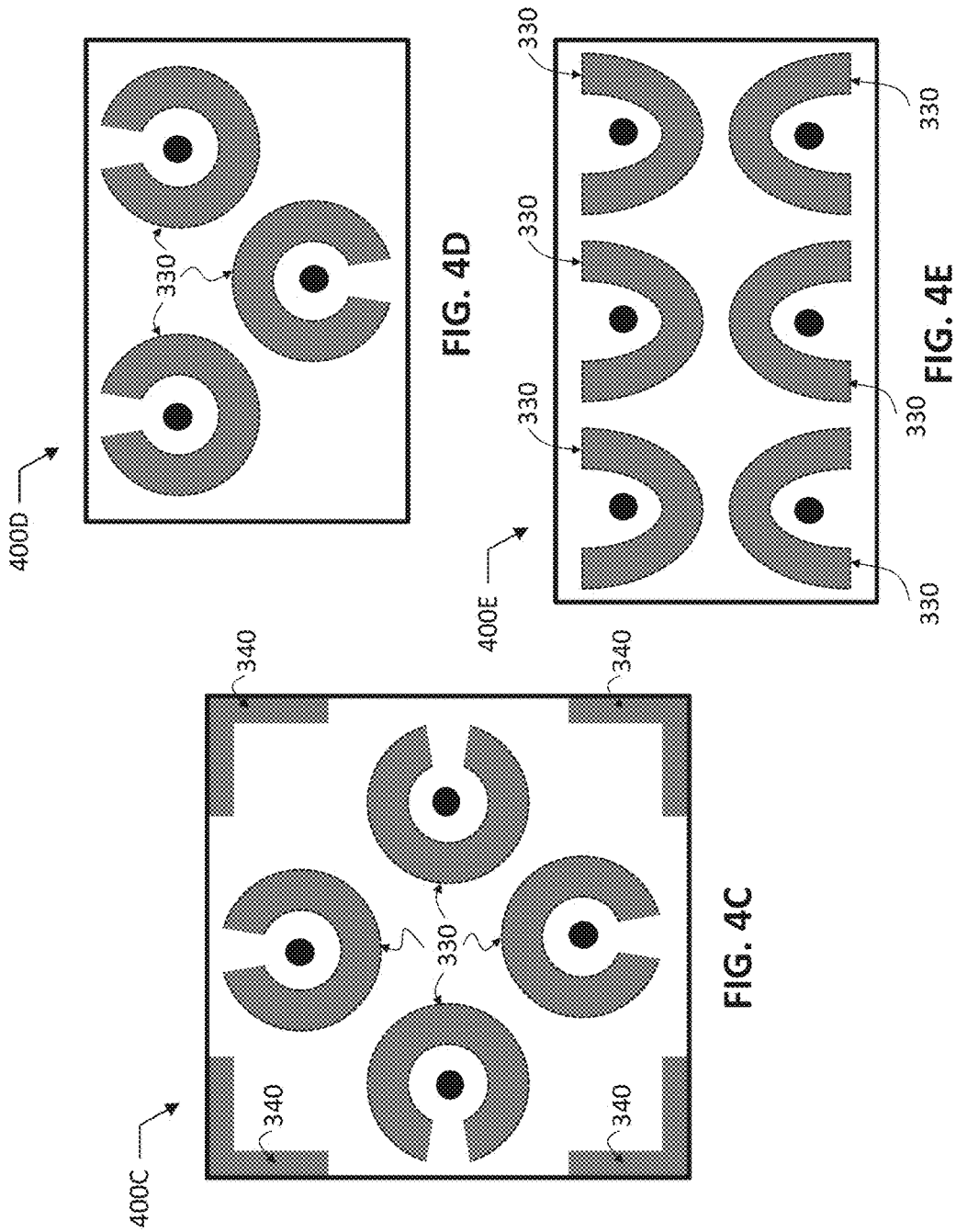

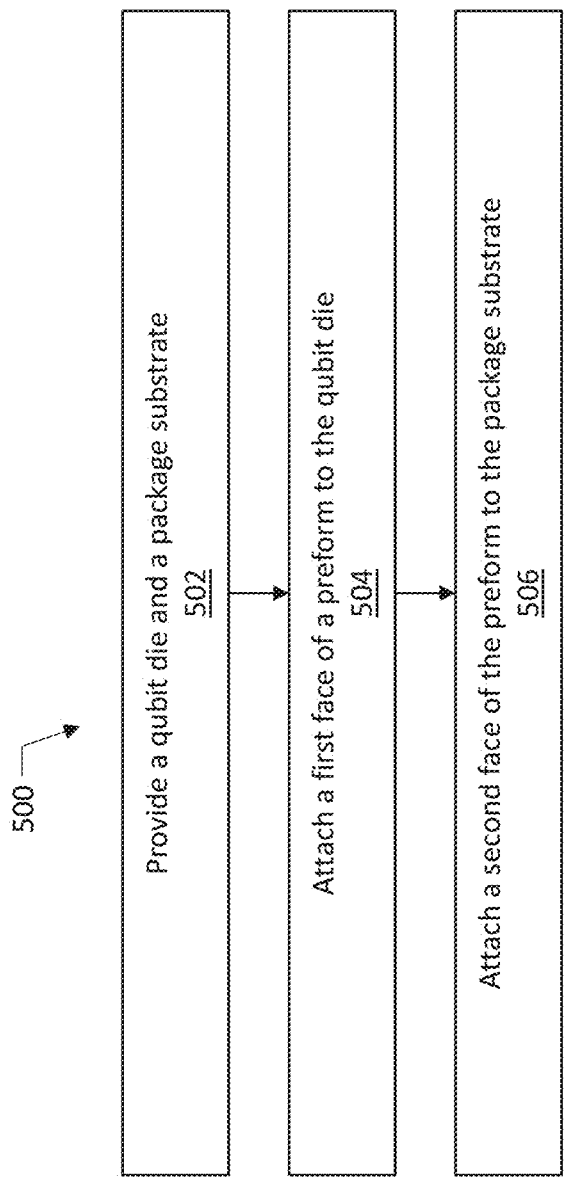

QUBIT DIE ATTACHMENT USING PREFORMS

TECHNICAL FIELD

This disclosure relates generally to the field of quantum computing, and more specifically, to packaging of dies on which quantum circuit/qubit devices are implemented.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled.

Designing and manufacturing quantum circuits is a nontrivial task because the unique quantum mechanical phenomena in such circuits lead to unique considerations which never had to be dealt with in classical, non-quantum, circuits, such as e.g. taking precautions in protecting qubits from decoherence so that they can stay in their information-holding states long enough to perform the necessary calculations and read out the results, and ability to operate at cryogenic temperatures. That is why, compared to well-established and thoroughly researched classical computers, quantum computing is still in its infancy, with the highest number of qubits in a solid-state quantum processor currently being below 100 and with the current manufacturing approaches being far from those which could be used in large-scale manufacturing. As the applications needing quantum circuits grow, the need for quantum circuit assemblies having improved performance also grows.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 4A-4E provide schematic illustrations of different preforms for coupling a qubit die to a package substrate according to various embodiments of the present disclosure.

FIG. 5 is a flow diagram of an exemplary method of fabricating a qubit device package that uses preforms for coupling a qubit die to a package substrate, according to some embodiments of the present disclosure.

DETAILED DESCRIPTION

Overview

Figure 1:
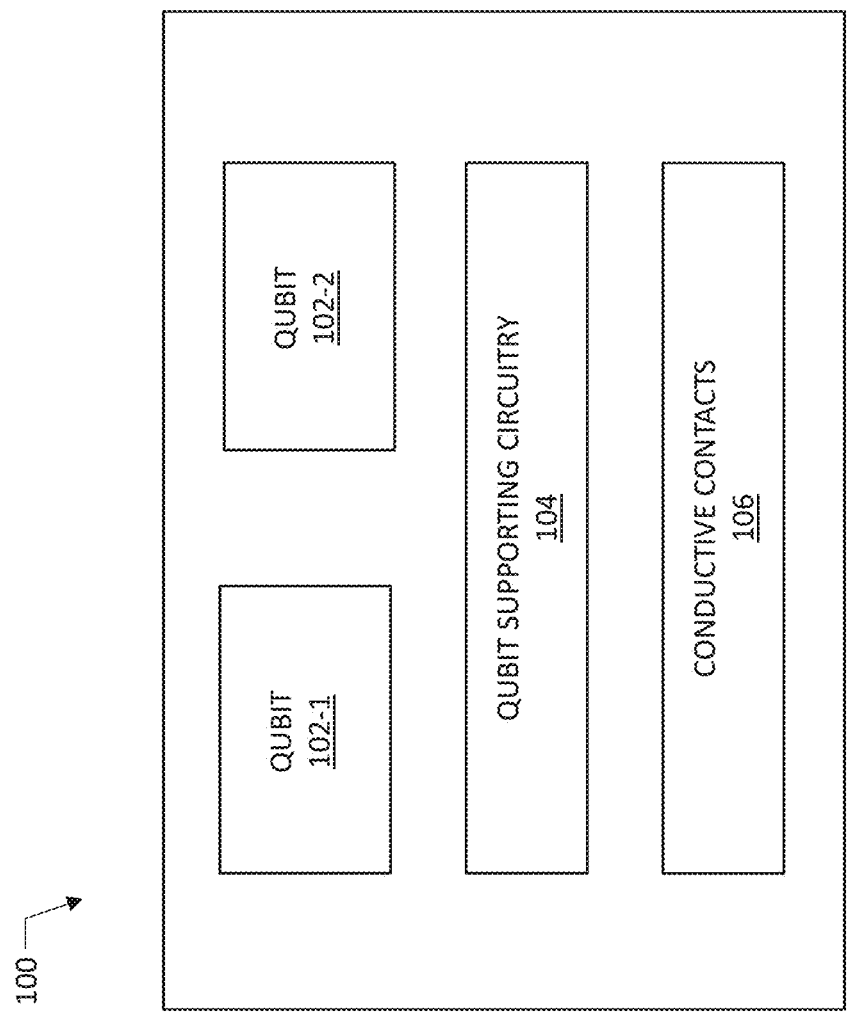
FIG. 1 provides a schematic illustration of an exemplary quantum circuit implementing superconducting qubits, according to some embodiments of the present disclosure.

As briefly described above, quantum computing, or quantum information processing, refers to the field of research related to computation systems that use quantum-mechanical phenomena to manipulate data. One example of quantum-mechanical phenomena is the principle of quantum superposition, which asserts that any two or more quantum states can be added together, i.e. superposed, to produce another valid quantum state, and that any quantum state can be represented as a sum of two or more other distinct states. Quantum entanglement is another example of quantum-mechanical phenomena. Entanglement refers to groups of particles being generated or interacting in such a way that the state of one particle becomes intertwined with that of the others. Furthermore, the quantum state of each particle cannot be described independently. Instead, the quantum state is given for the group of entangled particles as a whole. Yet another example of quantum-mechanical phenomena is sometimes described as a "collapse" because it asserts that when we observe (measure) particles, we unavoidably change their properties in that, once observed, the particles cease to be in a state of superposition or entanglement (i.e. by trying to ascertain anything about the particles, we collapse their state).

Put simply, superposition postulates that a given particle can be simultaneously in two states, entanglement postulates that two particles can be related in that they are able to instantly coordinate their states irrespective of the distance between them in space and time, and collapse postulates that when one observes a particle, one unavoidably changes the state of the particle and its' entanglement with other particles. These unique phenomena make manipulation of data in quantum computers significantly different from and significantly more challenging than that of classical computers (i.e. computers that use phenomena of classical physics). In addition, as briefly described above, protecting qubits from decoherence also remains to be a challenge.

As the foregoing illustrates, ability to manipulate and read out quantum states, making quantum-mechanical phenomena visible and traceable, and ability to deal with and improve on the fragility of quantum states of a qubit present unique challenges not found in classical computers. These challenges explain why so many current efforts of the industry and the academics continue to focus on a search for new and improved physical systems whose functionality could approach that expected of theoretically designed qubits. Physical systems for implementing qubits that have been explored until now include e.g. superconducting qubits, quantum dot qubits, vacancy center spin qubits, donor-based spin qubits, single trapped ion qubits, photon polarization qubits, etc. As used herein, the terms "qubit" and "qubit device" may be used interchangeably.

Packaging quantum devices implementing qubits, i.e. arranging a qubit die that houses a quantum circuit having one or more qubit devices with a package substrate intended to support electrical connectivity of the qubit die to further components, e.g. circuit boards or external control electronics, and to provide mechanical support in order to prevent physical damage and corrosion of the qubit die, is not an easy task. In particular, great care must be taken to minimize various sources for qubit decoherence and to minimize unintended coupling between various elements which can impact the gate fidelities and further impact the coherence. Conventionally, qubit devices have been packaged using wirebond packages. In wirebond packages, the qubits are placed on a qubit die facing away from a package substrate and the electrical connections to and from the qubit die are done using wirebonds at the periphery of the die. Such an approach has a number of disadvantages. For example, it requires electrical signals have to be routed to the edges of the qubit die which results in more complex designs and often leads to undesired coupling. Furthermore, for larger number of qubits, the die perimeter, and consequently its size, has to grow significantly to allow sufficient connections with good isolations, something that is not compatible with large-scale manufacturing envisioned for the future of quantum computing devices. Additionally, with standard wirebonding technologies, spurious resonances due to the die and package housings are a major challenge.

Embodiments of the present disclosure describe novel qubit device packages, as well as related computing devices and methods. In one embodiment, an exemplary qubit device package includes a qubit die (i.e. a first substrate) and a package substrate (i.e. a second substrate). The qubit die houses one or more qubit devices (hence the die is called a "qubit die"), which devices may also be referred to as a "quantum circuit" or a "quantum circuit assembly." The qubit die may be coupled to the package substrate using one or more preforms. Such preforms may provide electrical and/or mechanical coupling between the qubit die and the package substrate. In particular, when providing electrical coupling, a single preform may advantageously be used to replace a plurality of individual contacts, e.g. a plurality of individual solder bumps, electrically coupling the qubit die to the package substrate. Such preforms may also provide mechanical support. Other preforms may only provide mechanical support but not be used for electrical coupling. Various embodiments of such packages may reduce design complexity and undesired coupling, and enable inclusion of larger numbers of qubits in a single qubit die.

In some implementations, a qubit die may be attached to a package substrate so that at least portions of the one or more qubit devices provided on the qubit die are implemented on the face of the qubit die that is opposite the package substrate, i.e. the package may be referred to as a "flip-chip" package because the qubit die is "flipped" upside down so that the portions of the qubit devices are facing the package substrate.

In order to provide substantially lossless connectivity to, from, and between the qubits, electrically conductive portions of various quantum circuit elements described herein (e.g. various transmission lines described herein) may be made from one or more superconductors. However, some or all of these electrically conductive portions could be made from electrically conductive materials which are not superconductive. In the following, unless specified otherwise, reference to an electrically conductive material or an electrically conductive circuit element of a quantum circuit implies that a superconductor may, but does not have to, be used. Furthermore, materials described herein as "superconductors" (which may be described, interchangeably as "superconductive/superconducting materials") may refer to materials, including alloys of materials, which exhibit superconducting behavior at typical qubit operating conditions, e.g. materials which exhibit superconducting behavior at very low temperatures at which qubits may operate, but which do not necessarily exhibit such behavior at e.g. room temperatures. Some examples of materials which may be used as superconductors described herein include aluminum (Al), niobium (Ni), tin (Sn), titanium (Ti), osmium (Os), zinc (Zn), molybdenum (Mo), tantalum (Ta), vanadium (V), composites or alloys of such materials, e.g. niobium-titanium, niobium-aluminum, or niobium-tin, or nitrides of such materials, e.g. niobium nitride (NbN), titanium nitride (TiN), niobium titanium nitride (NbTiN), all of which are particular types of superconductors at qubit operating temperatures, as well as any combinations of any of these materials.

While some descriptions of various embodiments of the present disclosure are provided with reference to superconducting qubits, in particular to transmons, a particular class of superconducting qubits, at least some teachings of the present disclosure may be applicable to quantum circuits implementing other types of qubits, e.g. superconducting qubits other than transmons and/or qubits other than superconducting qubits, which may be packaged with a package substrate using one or more preforms as described herein, all of which are within the scope of the present disclosure. For example, the qubit device packages described herein may be used to package one or more of qubit dies implementing quantum dot qubits, qubit dies implementing vacancy center based spin qubits, qubit dies implementing donor-based spin qubits, qubit dies implementing hybrid semiconducting-superconducting quantum circuits, etc.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. The accompanying drawings are not necessarily drawn to scale.

In the drawings, some schematic illustrations of exemplary structures of various devices and assemblies described herein may be shown with precise right angles and straight lines, but it is to be understood that such schematic illustrations may not reflect real-life process limitations which may cause the features to not look so "ideal" when any of the structures described herein are examined using e.g. scanning electron microscopy (SEM) images or transmission electron microscope (TEM) images. In such images of real structures, possible processing defects could also be visible, such as e.g. not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Various aspects of the illustrative implementations may be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc. The terms "substantially," "close," "approximately," "near," and "about," generally refer to being within +/−20% of a target value based on the context of a particular value as described herein or as known in the art. Furthermore, as used herein, terms indicating what may be considered an idealized behavior, such as e.g. "superconducting" or "lossless", are intended to cover functionality that may not be exactly ideal but is within acceptable margins for a given application. For example, a certain level of loss, either in terms of non-zero electrical resistance or non-zero amount of spurious two-level systems may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

Still further, while the present disclosure may include references to microwave signals, this is done only because current qubits are designed to work with such signals because the energy in the microwave range is higher than thermal excitations at the temperature that qubits are typically operated at. In addition, techniques for the control and measurement of microwaves are well known. For these reasons, typical frequencies of qubits are in 1-10 GHz, e.g. in 3-10 GHz, range, in order to be higher than thermal excitations, but low enough for ease of microwave engineering. However, advantageously, because excitation energy of qubits may be controlled by the circuit elements, qubits could be designed to have any frequency. Therefore, in general, qubits could be designed to operate with signals in other ranges of electromagnetic spectrum and embodiments of the present disclosure could be modified accordingly. All of these alternative implementations are within the scope of the present disclosure.

Exemplary Quantum Circuit

In order to highlight the advantages offered by novel qubit device packages utilizing preforms described herein, it might be helpful to first describe various implementations of quantum circuits which could be included in a qubit die.

FIG. 1 provides a schematic illustration of an exemplary quantum circuit 100, according to some embodiments of the present disclosure. The exemplary quantum circuit 100 may be implemented on a qubit die to be packaged with a package substrate as described herein.

As shown in FIG. 1, an exemplary quantum circuit 100 may include two or more qubits 102 (reference numerals following after a dash, such as e.g. qubit 102-1 and 102-2 indicate different instances of the same or analogous element), qubit supporting circuitry 104, and a plurality of conductive contacts 106.

What is included within the qubits 102 depends on the type of qubits being implemented. For example, in case the quantum circuit 100 implements superconducting qubits (i.e. the qubits 102 are superconducting qubits), each of the qubits 102 may include one or more Josephson Junctions.

What is included within the supporting circuitry 104 may also depend on the type of qubits being implemented. In general, the qubit supporting circuitry 104 may include various circuit elements that support or enable the qubits 102 to act as qubits, i.e. as multi-level quantum systems, some examples of which are described below. Further, any other connections for providing microwave or other electrical signals to different circuit elements and components of the quantum circuit 100, such as e.g. connections between electrodes of various circuit components, or connections between ground lines/planes of a particular transmission line for equalizing electrostatic potential on the ground lines/planes, may be considered as being within the general category of "supporting circuitry." Still further, the term "supporting circuitry" may also be used to refer to elements providing electrical interconnections to/from/between quantum circuit elements/components and non-quantum circuit elements, which may also be provided in a quantum circuit, as well as to electrical interconnections between various non-quantum circuit elements provided in a quantum circuit. Examples of non-quantum circuit elements which may be provided in a quantum circuit may include various analog and/or digital systems, e.g. analog-to-digital converters, mixers, multiplexers, amplifiers, etc.

The conductive contacts 106 may include any means for supporting electrical connectivity between various elements of the qubit supporting circuitry 104 and associated elements of a package substrate to which a qubit die implementing the quantum circuit 100 is to be coupled. Such conductive contacts 106 may be provided at least on one face of a qubit die in which the quantum circuit 100 is implemented. Examples of conductive contacts 106 include metal based pads or solder mask based pads.

In various embodiments, quantum circuits such as the one shown in FIG. 1 may be used to implement components associated with a quantum integrated circuit (IC). Such components may include those that are mounted on or embedded in a quantum IC, or those connected to a quantum IC. The quantum IC may be either analog or digital and may be used in a number of applications within or associated with quantum systems, such as e.g. quantum processors, quantum amplifiers, quantum sensors, etc., depending on the components associated with the IC. The IC may be employed as part of a chipset for executing one or more related functions in a quantum system.

The qubits 102, the supporting circuitry 104, and the conductive contacts 106 of the quantum circuit 100 may be provided on, over, or at least partially embedded in a substrate/die (not shown in FIG. 1). The substrate may be any substrate suitable for realizing quantum circuits described herein. In one implementation, the substrate may be a crystalline substrate such as, but not limited to a silicon or a sapphire substrate, and may be provided as a wafer or a portion thereof. In other implementations, the substrate may be non-crystalline. In general, any material that provides sufficient advantages (e.g. sufficiently good electrical isolation and/or ability to apply known fabrication and processing techniques) to outweigh the possible disadvantages (e.g. negative effects of spurious two-level systems present), and that may serve as a foundation upon which a quantum circuit may be built, falls within the spirit and scope of the present disclosure. Additional examples of substrates include silicon-on-insulator (SOI) substrates, III-V substrates, and quartz substrates.

A qubit die housing the quantum circuit 100 may be packaged with a package substrate so that at least some of the conductive contacts 106 are electrically coupled to associate conductive contacts of the package substrate using one or more preforms as described herein. Furthermore, in some embodiments, one or more preforms may be used to provide mechanical support, either in combination with providing electrical connectivity or without providing any electrical connectivity, for the assembly of a qubit die implementing the quantum circuit 100 and a package substrate.

Quantum Circuits Implementing Superconducting Qubits

As mentioned above, what is included within the qubits 102 and the supporting circuitry 104 of the quantum circuit 100 shown in FIG. 1 may depend on the type of qubits being implemented. Some examples will now be described for the case when the quantum circuit 100 implements superconducting qubits.

Superconducting qubits operate based on a Josephson effect, which refers to a macroscopic quantum phenomenon of supercurrent, i.e. a current that, due to zero electrical resistance, flows indefinitely long without any voltage applied, across a device known as a Josephson Junction. Josephson Junctions are integral building blocks in quantum circuits employing superconducting qubit devices, forming the basis of quantum circuit elements that can approximate functionality of theoretically designed qubits. In general, a Josephson Junction includes two superconductors coupled by a so-called weak link that weakens the superconductivity between the two superconductors. In quantum circuits, a weak link of a Josephson Junction may e.g. be implemented by providing a thin layer of an insulator material, a conductive but not superconductive metal, or a semiconductor material, typically referred to as a "barrier" or a "tunnel barrier," sandwiched, in a stack-like arrangement, between two layers of superconductor, which two superconductors server as a first and a second electrode of a Josephson Junction. The Josephson Junction provides a non-linear inductive element to the circuit and allows the qubit to become an anharmonic oscillator. The anharmonicity is determined by the ratio of the charging energy, which stems from the total capacitance between various superconductive elements of the qubit, and the Josephson energy of the non-linear inductive element (e.g., Josephson Junction). The anharmonicity is what allows the state of the qubit to be controlled to a high level of fidelity. In addition to controlling the anharmonicity, the charging and Josephson energies also control the qubit frequency.

When the quantum circuit 100 implements superconducting qubits, i.e. when the qubits 102 are superconducting qubits, each of the qubits 102 may include one or more Josephson Junctions. In such an example, the qubit supporting circuitry 104 may include circuit elements electrically connected to the one or more Josephson Junctions, where such circuit elements in combination with the Josephson Junction(s) form a non-linear oscillator circuit providing multi-level quantum system where the first two to three levels define a qubit under normal operation. For the example, such circuit elements could include shunt capacitors, superconducting loops of a superconducting quantum interference device (SQUID), electrodes for setting an overall capacitance of a qubit, or/and ports for capacitively coupling the qubit to one or more of a readout resonator, a coupling resonator, and a direct microwave drive line or electromagnetically coupling the qubit to a flux bias line. Furthermore, when the qubits 102 are superconducting qubits, the qubit supporting circuitry 104 may further include various non-resonant transmission lines and resonators, functionality of which is described below.

Typically, when a superconducting qubit employs only one Josephson Junction, a frequency of the qubit cannot be changed substantially beyond what is defined by the design unless one of the qubit capacitive elements is tunable. Employing two or more Josephson Junctions, e.g. arranged in a so-called superconducting quantum interference device (SQUID), allows controlling the frequency of the qubit, which, in turn, allows greater control as to whether and when the qubit interacts with other components of a quantum circuit, e.g. with other qubits. In general, a SQUID of a superconducting qubit includes a pair of Josephson Junctions and a loop of a conductive, typically superconductive material (i.e. a superconducting loop), connecting a pair of Josephson Junctions. Applying a net magnetic field in a certain orientation to the SQUID loop of a superconducting qubit allows controlling the frequency of the qubit. In particular, applying magnetic field to the SQUID region of a superconducting qubit is generally referred to as a "flux control" of a qubit, and the magnetic field is generated by providing direct-current (DC) or a pulse of current through an electrically conductive or superconductive line generally referred to as a "flux bias line" (also known as a "flux line" or a "flux coil line"). By providing flux bias lines sufficiently close to SQUIDs, magnetic fields generated as a result of currents running through the flux bias lines extend to the SQUIDs, thus tuning qubit frequencies.

Microwave drive lines (also known as "microwave lines" or "drive lines") are typically used to control the states of superconducting qubits by providing a microwave pulse at the qubit frequency, which in turn stimulates (i.e. triggers) a transition between the 0 and 1 state of the qubit. By varying the length of this pulse, a partial transition can be stimulated, giving a superposition of the 0 and 1 states of the qubit.

The non-resonant transmission lines of the qubit supporting circuitry 104 may be used for communicating microwave signals to/from different quantum circuit elements and components, such as e.g. various control lines for various qubits. For example, for superconducting qubits, examples of the non-resonant transmission lines include flux bias lines, microwave feed lines, and direct drive lines.

Turning to the resonators of the qubit supporting circuitry 104 when the qubits 102 are superconducting qubits, in general, a resonator of a quantum circuit differs from a non-resonant microwave transmission line in that a resonator is a transmission line that is deliberately designed to support resonant oscillations (i.e. resonance) within the line, under certain conditions. In contrast, non-resonant transmission lines may be similar to conventional microwave transmission lines in that they are designed to avoid resonances, especially resonances at frequencies/wavelengths close to the resonant frequencies/wavelengths of any resonators in the proximity of such non-resonant lines. Once non-resonant transmission lines are manufactured, some of them may inadvertently support some resonances, but, during its design, efforts are taken to minimize resonances, standing waves, and reflected signals as much as possible, so that all of the signals can be transmitted through these lines without, or with as little resonance as possible. For example, the ends of non-resonant transmission lines may be engineered to have a specific impedance (e.g. substantially 50 Ohm) to minimize impedance mismatches to other circuit elements to which the lines are connected, in order to minimize the amount of reflected signal at transitions (e.g., transitions from the chip to the package, the package to the connector, etc.).

A resonator may be made with fixed boundary conditions, and these boundary conditions may control the frequencies/wavelengths which will resonate within a given transmission line structure used to implement a resonator. In order to satisfy boundary conditions for resonance, each end of a transmission line that implements a resonator can be either a node, if it is shorted to ground (e.g. by being electrically connected to a ground plane of a transmission line structure that implements the resonator, or to any other ground potential), or an antinode, if it is capacitively or inductively coupled to another quantum circuit element. Thus, resonators differ from non-resonant microwave transmission lines in how these lines are terminated. A line used to route a signal on a substrate, i.e. one of the non-resonant transmission lines, typically extends from a specific source, e.g. from one of the conductive contacts 106 on the qubit die configured to provide electrical connection to an external signal source via a package substrate, to a specific load on the qubit die, e.g. a short circuit proximate to a quantum dot device or another bonding pad or another electrical connection to a load. In other words, non-resonant transmission lines terminate with direct electrical connections to sources, ground sinks, and/or loads. On the other hand, a transmission line resonator is typically composed of a piece of transmission line terminated with either two open circuits (in case of a half-wavelength resonator) or an open and a short circuit (in case of a quarter-wavelength resonator). In this case, for a desired resonant frequency, transmission line length may e.g. be a multiple of a microwave wavelength divided by 2 or 4, respectively. However, other terminations are possible, for example capacitive or inductive, and in this case the required line length to support resonance will be different from that identified above. For example, capacitive terminations may be used for resonators which are coupled to qubits, to a feedline, line, or to another resonator by a capacitive interaction.

Besides line termination by capacitive or inductive coupling or a short circuit, in order to support resonant oscillations, transmission line segments of the resonators may need to be of a specific length that can support such oscillations. That is why, often times, resonators may be laid out on a qubit die longer than the actual distance would require (i.e. a non-resonant transmission line would typically be laid out to cover the distance in the most compact manner possible, e.g. without any curves, wiggles, or excess length, while a resonator may need to have curves, wiggles, and be longer than the shortest distance between the two elements the resonator is supposed to couple in order to be sufficiently long to support resonance).

One type of the resonators used with superconducting qubits are so-called coupling resonators (also known as "bus resonators"), which provide one manner for coupling different qubits together in order to realize quantum logic gates. Another type of the resonators used with superconducting qubits are so-called "readout resonators," which may be used to read the state(s) of qubits. These two types of resonators are analogous in concept and have analogous underlying physics as readout resonators, except that a coupling or "bus" resonator involves only capacitive couplings between two or more qubits whereas a readout resonator involves capacitive coupling between two or more qubits and a feedline. A coupling resonator may be implemented as a microwave transmission line segment that includes capacitive or inductive connections to ground on both sides (e.g. a half-wavelength resonator), which results in oscillations (resonance) within the transmission line. While the ends of a coupling resonator have open circuits to the ground, each side of a coupling resonator is coupled, either capacitively or inductively, to a respective (i.e. different) qubit by being in the appropriate location and sufficient proximity to the qubit. Because different regions of a coupling resonator have coupling with a respective different qubit, the two qubits are coupled together through the coupling resonator. Thus, coupling resonators may be employed for implementing logic gates.

Turning to readout resonators, a readout resonator, similar to the bus/coupling resonator, is a transmission line segment. On one end it may have an open circuit connection to ground as well as any capacitively or inductively coupled connections to other quantum elements or a non-resonant microwave feedline. On the other end, a readout resonator may either have a capacitive connection to ground (for a half-wavelength resonator) or may have a short circuit to the ground (for a quarter-wavelength resonator), which also results in oscillations within the transmission line, with the resonant frequency of the oscillations being close to the frequency of the qubit. In some embodiments, a corresponding readout resonator may be provided for each qubit. A readout resonator is coupled to a qubit by being in the appropriate location and sufficient proximity to the qubit, again, either through capacitive or inductive coupling. Due to a coupling between a readout resonator and a qubit, changes in the state of the qubit result in changes of the resonant frequency of the readout resonator. In turn, changes in the resonant frequency of the readout resonator can be read externally via connections which lead to external electronics e.g. wire or solder bonding pads.

For the non-resonant transmission lines, some descriptions of flux bias lines were provided above and, in the interests of brevity are not repeated here. In general, running a current through a flux bias line, provided via one or more of the conductive contacts 106, allows tuning (i.e. changing) the frequency of a corresponding qubit 102 to which a given flux bias line is connected. As a result of running the current in a given flux bias line, magnetic field is created around the line. If such a magnetic field is in sufficient proximity to a given qubit 102, e.g. by a portion of the flux bias line being provided next (sufficiently close) to the qubit 102, the magnetic field couples to the qubit, thereby changing the spacing between the energy levels of the qubit. This, in turn, changes the frequency of the qubit since the frequency is directly related to the spacing between the energy levels via the equation E=hv (Planck's equation), where E is the energy (in this case the energy difference between energy levels of a qubit), h is the Planck's constant and v is the frequency (in this case the frequency of the qubit). As this equation illustrates, if E changes, then v changes. Different currents and pulses of currents can be sent down each of the flux lines allowing for independent tuning of the various qubits.

Typically, the qubit frequency may be controlled in order to bring the frequency either closer to or further away from another resonant item, for example a coupling resonator or a coupled neighbor qubit, to implement multi-qubit interactions, as may be desired in a particular setting.

For example, if it is desirable that a first qubit 102-1 and a second qubit 102-2 interact, via a coupling resonator connecting these qubits, then both qubits 102 may need to be tuned to be at nearly the same frequency or a detuning equal, or nearly equal, to the anharmonicity. One way in which such two qubits could interact is that, if the frequency of the first qubit 102-1 is tuned very close to the resonant frequency of the coupling resonator, the first qubit can, when in the excited state, relax back down to the ground state by emitting a photon (similar to how an excited atom would relax) that would resonate within the coupling resonator. If the second qubit 102-2 is also at this energy (i.e. if the frequency of the second qubit is also tuned very close to the resonant frequency of the coupling resonator), then it can absorb the photon emitted from the first qubit, via the coupling resonator coupling these two qubits, and be excited from its ground state to an excited state. Thus, the two qubits interact, or are entangled, in that a state of one qubit is controlled by the state of another qubit. In other scenarios, two qubits could interact via exchange of virtual photons, where the qubits do not have to be tuned to be at the same frequency with one another. In general, two or more qubits could be configured to interact with one another by tuning their frequencies to specific values or ranges.

On the other hand, it may sometimes be desirable that two qubits 102 coupled by a coupling resonator do not interact, i.e. the qubits are independent. In this case, by applying magnetic flux, by means of controlling the current in the appropriate flux bias line, to one qubit it is possible to cause the frequency of the qubit to change enough so that the photon it could emit no longer has the right frequency to resonate on the coupling resonator or on the neighboring qubit via a virtual photon transfer through the bus. If there is nowhere for such a frequency-detuned photon to go, the qubit will be better isolated from its surroundings and will live longer in its current state. Thus, in general, two or more qubits could be configured to reduce interactions with one another by tuning their frequencies to specific values or ranges.

The state(s) of each qubit 102 may be read by way of its corresponding readout resonator. The state of qubit 102 induces a shift in the resonant frequency in the associated readout resonator. This shift in resonant frequency can then be read out using its coupling to a feedline. To that end, an individual readout resonator may be provided for each qubit. As described above, a readout resonator may be a transmission line segment that includes a capacitive connection to ground on one side and is either shorted to the ground on the other side (for a quarter-wavelength resonator) or has a capacitive connection to ground (for a half-wavelength resonator), which results in oscillations within the transmission line (resonance) that depends upon the state of a proximal qubit. A readout resonator may be coupled to its corresponding qubit 102 by being in an appropriate location and sufficient proximity to the qubit, more specifically in an appropriate location and sufficient proximity to a first element (or "island") of the qubit 102 that capacitively couples to the readout resonator, when the qubit is implemented as a transmon. Due to a coupling between the readout resonator and the qubit, changes in the state of the qubit result in changes of the resonant frequency of the readout resonator. In turn, by ensuring that the readout resonator is in sufficient proximity to a corresponding microwave feedline, changes in the resonant frequency of the readout resonator induce changes in the transmission coefficients of the microwave feedline which may be detected externally.

A coupling resonator, or, more generally, a coupling component, allows coupling different qubits together, e.g. as described above, in order to realize quantum logic gates. A coupling component could be comprised of a coupling component on a neighboring qubit, a lumped element capacitor, a lumped element resonator, or a transmission line segment. A coupling transmission line segment (e.g., coupling resonator or bus resonator) is similar to a readout resonator in that it is a transmission line segment that includes capacitive connections to various objects (e.g., qubits, ground, etc.) on both sides (i.e. a half-wavelength resonator), which also results in oscillations within the coupling resonator. Each side/end of a coupling component is coupled (again, either capacitively or inductively) to a respective qubit by being in appropriate location and sufficient proximity to the qubit, namely in sufficient proximity to a first element (or "island") of the qubit that capacitively couples to the coupling component, when the qubit is implemented as a transmon. Because each side of a given coupling component has coupling with a respective different qubit, the two qubits are coupled together through the coupling component. Thus, coupling components may be employed in order to implement multi-qubit interactions.

In some implementations, a microwave line may be used to not only readout the state of the qubits as described above, but also to control the state of the qubits. When a single microwave line is used for this purpose, the line operates in a half-duplex mode where, at some times, it is configured to readout the state of the qubits, and, at other times, it is configured to control the state of the qubits. In other implementations, microwave lines may be used to only readout the state of the qubits as described above, while separate drive lines, may be used to control the state of the qubits. In such implementations, microwave lines used for readout may be referred to as readout lines, while microwave lines used for controlling the state of the qubits may be referred to as drive lines. Drive lines may control the state of their respective qubits 102 by providing to the qubits a microwave pulse at the qubit frequency, which in turn stimulates (i.e. triggers) a transition between the states of the qubit. By varying the length of this pulse, a partial transition can be stimulated, giving a superposition of the states of the qubit.

In the embodiments where the quantum circuit 100 implements qubits other than superconducting qubits, descriptions as provided above are still applicable except that the qubits 102 would not include Josephson Junctions and at least some elements of the supporting circuitry 104 may differ from those described above.

Figure 2:
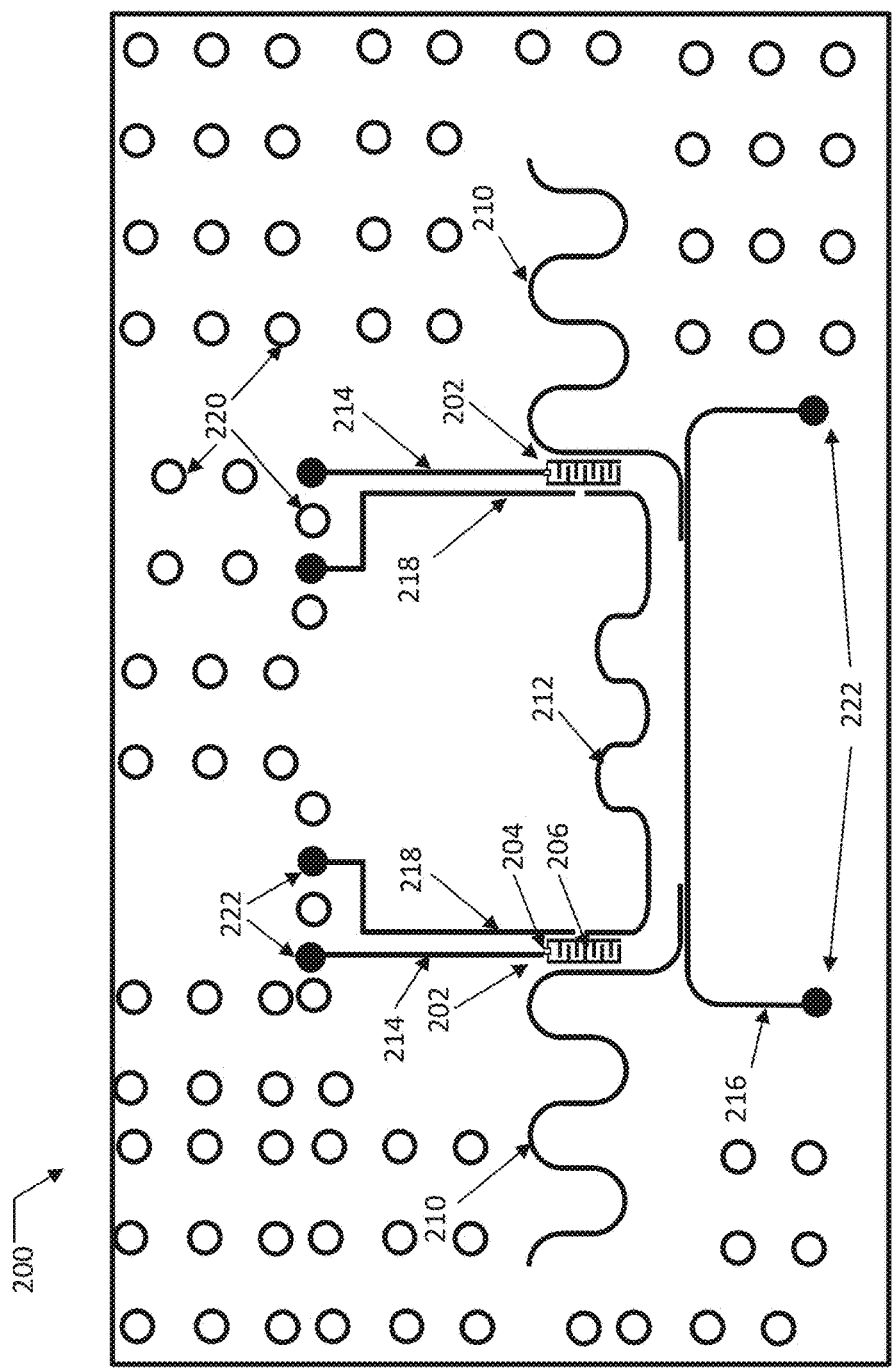
FIG. 2 provides a schematic illustration of an exemplary physical layout of a quantum circuit implementing superconducting qubits, according to some embodiments of the present disclosure.

FIG. 2 provides a schematic illustration of an exemplary physical layout of a quantum circuit 200 implementing superconducting qubits 202, according to some embodiments of the present disclosure. The quantum circuit 200 may be seen as illustrating an exemplary layout of the quantum circuit 100 shown in FIG. 1 where the qubits 102, now shown in FIG. 2 as qubits 202, are implemented as transmons, a particular class of superconducting qubits characterized by the use of capacitors as some elements of the supporting circuitry 104. Similar to FIG. 1, a qubit die housing the quantum circuit 200 may be packaged with a package substrate so that at least some of the conductive contacts of the quantum circuit 200, described in greater detail below, are electrically coupled to associate conductive contacts of the package substrate using one or more preforms as described herein. Furthermore, in some embodiments, one or more preforms may be used to provide mechanical support, either in combination with providing electrical connectivity or without providing any electrical connectivity, for the assembly of a qubit die implementing the quantum circuit 200 and a package substrate.

Transmons, which are a type of charge qubits with the name being an abbreviation of "transmission line shunted plasma oscillation qubits," are particularly promising for building quantum circuits and quantum computing devices because they exhibit reduced sensitivity to charge noise. The use of transmons is shown in FIG. 2 by illustrating that each of the two qubit 202 shown in FIG. 2 includes an interdigitated capacitor 206 (labeled for only one of the two qubits 202 shown in FIG. 2 in order to not clutter the drawing) and a SQUID loop 204 (a small square shown in FIG. 2, also labeled for only one of the two qubits 202 shown in FIG. 2). The capacitor 206 shown in FIG. 2 may be seen as an example of the supporting circuitry 104 shown in FIG. 1, while the Josephson Junctions of the SQUID loop 204 shown in FIG. 2 (Josephson Junctions not shown specifically in FIG. 2) may be seen as an example of an element included as a part of the qubit 102 shown in FIG. 1. In other embodiments, the capacitors 206 may be any other type of capacitors, not necessarily interdigitated capacitors as shown in FIG. 2.

Similar to FIG. 1, FIG. 2 illustrates two qubits 202. In addition, FIG. 2 illustrates exemplary layout of readout resonators 210 (one readout resonator 210 per qubit 202), a coupling resonator 212 coupling the two qubits 202, flux bias lines 214 (one flux bias line 214 per qubit 202), a microwave feedline 216 (illustrated as a single microwave feedline 216, although in other embodiments individual microwave feedlines may be used for each of the qubits 202), and drive lines 218. The readout and coupling resonators 210, 212, flux bias lines 214, microwave feedline 216, and drive lines 218 may be seen as examples of the supporting circuitry 104 shown in FIG. 1. Functionality of each of these elements is described above, and, therefore, in the interests of brevity, is not repeated here.

In various embodiments, various conductive circuit elements shown in FIG. 2, e.g. resonators or various non-resonant transmission lines included in she quantum circuit 200 could have different shapes and layouts, and could be placed at different locations with respect to one another compared to what is shown in the example of FIG. 2. In general, the term "line" as e.g. used herein in context of resonant or non-resonant transmission lines, or e.g. signal lines of such transmission lines, does not imply straight lines, unless specifically stated so. For example, some resonators or non-resonant transmission lines or parts thereof (e.g. conductor strips of resonators or non-resonant transmission lines, which conductor strips may also be referred to as "signal lines") may comprise more curves, wiggles, and turns while other resonant or non-resonant transmission lines or parts thereof may comprise less curves, wiggles, and turns, and some resonators or non-resonant transmission lines, or parts thereof, may comprise substantially straight lines. In some embodiments, various resonators or non-resonant transmission lines may intersect one another, in such a manner that they don't make an electrical connection, which can be done by using e.g. a bridge, bridging one interconnect over the other. As long as these resonators and non-resonant transmission lines operate in accordance with use of these structures as known in the art for which some exemplary principles were described above, quantum circuits with different shapes and layouts of these quantum circuit elements than those illustrated in FIG. 2 are all within the scope of the present disclosure.

FIG. 2 further illustrates that the quantum circuit 200 includes various conductive contacts 220, 222 shown in FIG. 2 as white and black circles, respectively. Such conductive contacts 220, 222 may be examples of the conductive contacts 106 shown in FIG. 1. The white circles, only three of which are labeled in FIG. 2 with the reference numeral 220 in order to not clutter the drawing, illustrate exemplary locations of ground conductive contacts 220 (i.e. contacts which are to be connected to a ground potential via a package substrate during operation of a quantum circuit), e.g. conductive bumps, at a face of the qubit die, to be connected to the opposing face of a package substrate. As is known in the art, such ground contacts are typically used when a die supports propagation of microwave signals in order to e.g. suppress microwave parallel plate modes, cross-coupling between circuital blocks, and substrate resonant modes. In general, providing ground pathways may improve signal quality, enable fast pulse excitation, suppress radiation loss and undesired resonator modes, and improve the isolation between the different lines. The black circles, only two of which are labeled in FIG. 2 with the reference numeral 222 in order to not clutter the drawing, illustrate exemplary locations of signal conductive contacts 222 (i.e. contacts which are to be connected to a signal source via a package substrate during operation of a quantum circuit), e.g. conductive bumps, at a face of the qubit die, to be connected to the opposing face of a package substrate. The signals conductive contacts 222 may be used for programming, tuning and readout of the qubits, e.g. as described above. The die on which these conductive contacts 220, 222 and the rest of the quantum circuit are provided may include multiple conductive layers that may be electrically isolated from each other by an insulating material, which could include any suitable material, such as an interlayer dielectric (ILD). Examples of insulating materials may include silicon oxide, silicon nitride, aluminum oxide, carbon-doped oxide, and/or silicon oxynitride.

The illustration of the location and the number of the ground contacts 220 and the signal contacts 222 in FIG. 2 is purely illustrative and, in various embodiments, the contacts 220, 222 may be provided at different places, as known in microwave engineering. In particular, at least some of the conductive contacts 220, 222 may be coupled to associated conductive contacts of a package substrate using one or more preforms as described herein. In some such embodiments, although not specifically shown in FIG. 2, at least some of the conductive contacts 220, 222 may be shaped to form lines with curves as described herein, e.g. a single ground conductive contact 220 may be shaped as a line that includes at last one curved portion that at least partially encloses a given signal conductive contact 222, as described in greater detail below.

While FIGS. 1 and 2 illustrate examples of quantum circuits comprising only two qubits, embodiments with any larger number of qubits are possible and are within the scope of the present disclosure.

Packaging of a Qubit Die with a Package Substrate Using Preforms

Figure 3:
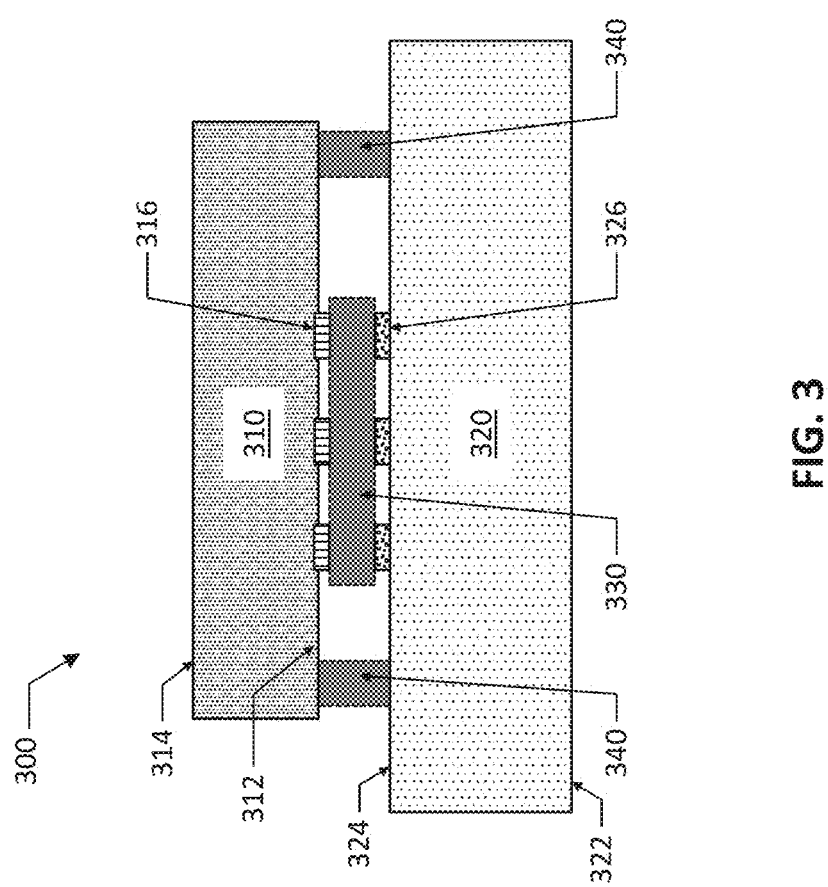
FIG. 3 provides a schematic illustration of an exemplary qubit device package coupling a die with one or more qubit devices to a package substrate using one or more preforms, according to various embodiments of the present disclosure.

FIG. 3 provides a schematic illustration of an exemplary qubit device package 300 coupling a qubit die 310 to a package substrate 320 using one or more preforms, according to various embodiments of the present disclosure. In some embodiments, electrical coupling between the qubit die 310 and the package substrate 320 may be realized using one or more preforms 330, an implementation of one of which is schematically illustrated in FIG. 3. Such one or more preforms 330 may also provide mechanical support for the qubit die 310. In some embodiments, mechanical support for the qubit die 310 may be provided using one or more preforms 340, an implementation of two of which is schematically illustrated in FIG. 3 as well. In various embodiments, any number of one or more preforms 330, 340, may be implemented in a package such as the package 300 and, in some embodiments, besides including any of such preforms, the package 300 may further include other, e.g. conventional, interconnect structures providing electrical and/or mechanical coupling between the qubit die 310 and the package substrate 320, e.g. solder bumps, posts, etc.

The qubit die 310 may include one or more quantum circuits implementing one or more qubit devices, e.g. the qubit die 310 may include one or more quantum circuits 100, 200, any combination or any further variations of these circuits as described above, where one or more preforms 330 may be used to provide electrical connectivity for the qubit die 310 by coupling at least some of the conductive contacts of such quantum circuits to associated conductive contacts of the package substrate 320. The specifics of these quantum circuits are not shown in FIG. 3 in order to not clutter the drawing.

FIG. 3 illustrates that the qubit die 310 may have a first face 312 and an opposing second face 314, and the package substrate 320 may have a first face 322 and an opposing second face 324. FIG. 3 further illustrates that a preform 330 may couple conductive contacts 316 at the first face 312 of the qubit die 310 and conductive contacts 326 at the second face 324 of the package substrate 320. Three conductive contacts 316 and three conductive contacts 326 are illustrated in the example shown in FIG. 3, however, any number of the conductive contacts 316, 326 may be used according to various embodiments of the present disclosure. Furthermore, while the conductive contacts 316, 326 are shown in the example of FIG. 3 as metal based pads (which can be seen in FIG. 3 because contacts 316, 326 are shown to extend away from the respective faces on which they are provided), in other embodiments, the conductive contacts 316, 326 may be implemented as solder mask based pads, or any other form of conductive contacts known in the art (not specifically shown in FIG. 3). The illustration of the location, the type, and the number of the conductive contacts on the qubit die 310 and/or on the package substrate 320, as well as of the preforms 330, 340 shown in FIG. 3 is purely illustrative and, in various embodiments, the conductive contacts on the qubit die 310 and/or on the package substrate 320, as well as of the preforms 330, 340, may be implemented differently, in accordance with various embodiments of the present disclosure and as known for package substrates. Various exemplary implementations of the preforms 330, 340 that may be used to couple the qubit die 310 and the package substrate 320 are illustrated in FIGS. 4A-4E.

Although not specifically shown in FIG. 3, conductive pathways may extend and be coupled between components/elements of the quantum circuit implemented on the qubit die 310 and the conductive contacts 316 disposed at the first face 312. In some embodiments, at least portions of the quantum circuit implemented on the qubit die 310 may be provided over the first face 312, e.g. resonators, Josephson Junctions, flux bias lines, etc. in case the qubit die 310 implements a superconducting quantum circuit. Similarly, although not specifically shown in FIG. 3, conductive pathways may also extend through an insulating material of the package substrate 320, e.g. between the first face 322 and the second face 324 of the package substrate 320, electrically coupling various ones of the conductive contacts 326 at the second face of the package substrate 320 to various ones of conductive contacts at the first face 322 (the latter conductive contacts not specifically shown in FIG. 3), in any desired manner. The insulating material used in the package substrate 320 may be a dielectric material (e.g., an ILD, a silica filled resin, a build-up polymer, a glass cloth reinforced resin or a ceramic composite), and may take the form of any of the embodiments of the insulating materials disclosed herein, for example any suitable polymer, ceramic, polymer composite, oxide or nitride materials. In some embodiments, conductive pathways within the package substrate 320 may be arranged in a suitable metallization stack for providing electrical connectivity to the qubit die 310.

In various embodiments, conductive pathways in the qubit die 310 or in the package substrate 320 may include one or more conductive vias, one or more conductive lines, or a combination of conductive vias and conductive lines, for example. The conductive vias and/or lines that provide the conductive pathways in/on the qubit die 310 or/and in/on the package substrate 320 may be formed using any suitable techniques. Examples of such techniques may include subtractive fabrication techniques, additive or semi-additive fabrication techniques, single damascene fabrication techniques, dual damascene fabrication techniques, or any other suitable technique. In some embodiments, layers of insulating material, such as e.g. oxide material or nitride material or any other insulating materials described herein or known in the art, may insulate various structures in the conductive pathways from proximate structures, and/or may serve as etch stops during fabrication. In some embodiments, additional layers, such as e.g. diffusion barrier layers or/and adhesion layers may be disposed between conductive material and proximate insulating material. Diffusion barrier layers may reduce diffusion of the conductive material into the insulating material. Adhesion layers may improve mechanical adhesion between the conductive material and the insulating material.

In various embodiments, any of the conductive contacts at the first face of the qubit die 310 and at the second face of the package substrate 320 may be formed of any suitable electrically conductive material (e.g., a superconducting material). For example, in some embodiments, the conductive contacts on the qubit die 310 and/or on the package substrate 320 may include aluminum, and the preforms 330 may include an indium-based solder. In some embodiments, the conductive contacts on the qubit die 310 and/or on the package substrate 320 may include multiple layers of material that may be selected to serve different purposes. In some embodiments, such conductive contacts may be formed of aluminum, and may include a layer of gold (e.g., with a thickness of less than 1 micron) between the aluminum and the adjacent interconnect structure, e.g. a preform, to limit the oxidation of the surface of the contacts and improve the adhesion with adjacent solder. In some embodiments, the conductive contacts may be formed of aluminum, and may include a layer of a barrier metal such as nickel, as well as a layer of gold, wherein the layer of barrier metal is disposed between the aluminum and the layer of gold, and the layer of gold is disposed between the barrier metal and the adjacent interconnect structure, e.g. a preform. In such embodiments, the gold may protect the barrier metal surface from oxidation before assembly, and the barrier metal may limit the diffusion of solder from the adjacent interconnects into the aluminum. In various embodiments, the conductive contacts on the qubit die 310 and/or on the package substrate 320 may take form of solder bond pads, metal defined pads, solder mask defined pads, conductive epoxies, anisotropic conductive films, copper to copper bonding posts, etc., to route electrical signals to/from the qubit die 310.

In some embodiments, the package substrate 320 may be or may otherwise include a silicon interposer, and the conductive pathways in the package substrate 320 may be through-silicon vias. Silicon may have a desirably low coefficient of thermal expansion compared with other dielectric materials that may be used for the insulating material, and thus may limit the degree to which the package substrate 320 expands and contracts during temperature changes relative to such other materials (e.g., polymers having higher coefficients of thermal expansion).

In one implementation, the qubit die 310 and the package substrate 320 may be a crystalline substrate such as, but not limited to a silicon or a sapphire substrate, and may be provided as a wafer or a portion thereof. In other implementations, one or more of these substrates may be non-crystalline, and, in general, any of the substrate types described above may be used.

In some implementations, the package substrate 320 may be used to couple the qubit die 310 to a further die (not specifically shown in FIG. 3). In some embodiments, such a further die may also be a qubit die similar to the qubit die 310, i.e. a die implementing one or more quantum circuits/devices as described herein. In other embodiments, such a further die may include one or more non-quantum circuits, e.g. the die may include control logic for controlling the operation of the superconducting quantum circuit provided on the qubit die 310, thus providing control logic integrated with the superconducting qubit die 310 on the same chip or the same package 300. In some embodiments, the control logic may provide peripheral logic to support the operation of the superconducting quantum circuit provided on the qubit die 310. For example, the control logic may control the performance of a read operation, control the performance of a write operation, control the clearing of quantum bits, etc. The control logic may also perform conventional computing functions to supplement the computing functions which may be provided by the quantum circuit provided on the qubit die 310. For example, the control logic may interface with one or more of the other components of a quantum computing device, such as e.g. a quantum computing device 2000 described below, in a conventional manner, and may serve as an interface between a quantum circuit provided on the qubit die 310 and conventional components. In some embodiments, the control logic may be implemented in or may be used to implement a non-quantum processing device 2028 described below with reference to FIG. 8. In various embodiments, mechanisms by which the control logic controls operation of a quantum circuit provided on the qubit die 310 may be take the form of an entirely hardware embodiment, an entirely software embodiment (including firmware, resident software, micro-code, etc.) or an embodiment combining software and hardware aspects. For example, the control logic may implement an algorithm executed by one or more processing units, e.g. one or more microprocessors, of one or more computers. The control that the control logic would exercise over the operation of a quantum circuit provided on the qubit die 310 would depend on the type of qubits that the quantum circuit component uses. For example, if the quantum circuit component uses superconducting qubits, the control logic could be configured to provide appropriate currents in any of flux bias lines, microwave lines, and/or drive lines in order to initialize and manipulate the superconducting dots, e.g. as described herein. In some embodiments of superconducting qubits, the control logic may be configured to detect current(s) in microwave line(s) and to control the operation of the superconducting quantum circuit provided on the qubit die 310 based on the detected current(s). By detecting current in a microwave line, the control logic may be able to assess/detect the state of the corresponding qubit(s) to which the line is coupled. In some further embodiments, the control logic may further be configured to also control the current(s) in microwave line(s). By controlling the current in a microwave line, control logic may be configured to control (e.g. change) the state of the corresponding qubit(s) to which the line is coupled. In such further embodiments, the control logic may be configured to switch operation of the microwave lines between controlling the current in the microwave lines to control states of the qubit(s) and detecting the current in the microwave lines to detect the states of the qubit(s). Thus, the control logic can operate the microwave lines in a half-duplex mode where the microwave lines are either used for readout or for setting the state(s) of the corresponding qubits. In some embodiments of superconducting qubits, the control logic may be configured to control current(s) in one or more drive lines. By controlling the current in a drive line, control logic is configured to control (e.g. change) the state of the corresponding qubit(s) to which the line is coupled. When drive lines are used, the control logic can use the microwave lines for readout of the state(s) of the corresponding qubits and use the drive lines for setting the state(s) of the qubits, which would be an alternative to the half-duplex mode implementation described above. For example, the control logic may be configured to control the current in the one or more drive lines by ensuring provision of one or more pulses of the current at a frequency of the one or more qubits. In this manner, the control logic can provide a microwave pulse at the qubit frequency, which in turn stimulates (i.e. triggers) a transition between the states of the corresponding qubit. In some embodiments, the control logic may be configured to control a duration of these pulses. By varying the length/duration of the pulse(s), the control logic can stimulate a partial transition between the states of the corresponding qubit, giving a superposition of the states of the qubit. In some embodiments, the control logic may be configured to determine the values of the control signals applied to the elements of a quantum circuit provided on the qubit die 310.

In some embodiments, the further die to which the qubit die 310 may be coupled via the package substrate 320 may further include circuits performing additional or different functionality than the control logic described above. For example, such a further die may include components of a wireless communication device, such as e.g. amplifiers, radio frequency (RF) receivers, RF transmitters, etc., in order to enable wireless communication between the qubit die 310 and various external devices.

In various embodiments, preforms as described herein, e.g. the preforms 330, may be used as first-level interconnects coupling conductive contacts 316 at the first face 312 of the qubit die 310 and conductive contacts 326 at the second face 324 of the package substrate 320.

In some embodiments, any of the one or more preforms 330 may include a solder preforms, utilizing any suitable solder material, e.g. indium, bismuth, silver or gallium.

In some embodiments, any of the one or more preforms 330 may include an electrically conductive core coated with a solder material, e.g. a copper core coated with any suitable solder material, e.g. indium, bismuth, silver or gallium. In other embodiments, such preforms may include a non-conductive core coated with a solder material, e.g. the core may be made of ceramic material, high-temperature polymer material, silicon, or glass. In various embodiments, the solder material used in the preforms may include a low-temperature solder (e.g., a solder having a melting point below 100 degrees Celsius) so that it can be melted to couple the conductive contacts at the qubit die 310 and the conductive contacts at the package substrate 320 without having to expose the qubit die 310 to higher temperatures and risk damaging the quantum circuit(s) implemented thereon. Examples of such solders that may be suitable for quantum circuits include indium-based solders (e.g., solders including indium alloys). In some embodiments, the solder material used in the preforms described herein may have a melting point that is less than 180 degrees Celsius.

In some embodiments, any of the one or more preforms 330 as described herein may include an electrically conductive material that is continuous between two or more of the conductive contacts at the first face of the qubit die 310 and the associated one or more conductive contacts at the second face of the package substrate 320.

In some embodiments, preforms 340 which are used to provide mechanical support but not electrical connectivity, may be implemented in any of the manners described above for the preforms 330. In other embodiments, preforms 340 may include any suitable non-conductive material(s), such as ceramic material, high-temperature polymer material, silicon, or glass.

FIGS. 4A-4E provide schematic illustrations of different preforms for coupling a qubit die to a package substrate according to various embodiments of the present disclosure. While FIGS. 4A-4E are described with reference to coupling the qubit die 310 to the package substrate 320, such preforms may be used to couple any qubit die implementing a quantum circuit with one or more qubit devices, e.g. the quantum circuit 100, to any package substrate.

FIG. 4A illustrates an exemplary top view of a physical layout 400A of conductive contacts 420, 422 of a quantum circuit implemented in a qubit die such as the qubit die 310, according to some embodiments of the present disclosure. The conductive contacts 420, 422 may be similar to the conductive contacts 220, 222 described above in that the black circles shown in FIG. 4A may illustrate signal conductive contacts 422, while all of the other circles shown in FIG. 4A may illustrate ground conductive contacts 420; furthermore, the conductive contacts 420, 422 shown in FIG. 4A may be examples of the conductive contacts 316 at the first face 312 of the qubit die 310. In the embodiments where multiple conductive contacts 420, 422 may be provided on the first face of the qubit die 310, at least one preform 330 may be used to connect two or more conductive contacts 420, 422 to corresponding conductive contacts 326 of the package substrate 320. Namely, FIG. 4A provides a schematic illustration of a first preform 330-1 and a second preform 330-2, each of which may be used to couple more than one ground conductive contacts 420 to a corresponding one or more conductive contacts 326 of the package substrate (the latter not specifically shown in FIG. 4A). FIG. 4A further illustrates that the first and second preforms 330-1, 330-2 may be repeated over the qubit die 310. FIG. 4A also illustrates that, in some embodiments, not all ground conductive contacts 420 may be connected using preforms 330, i.e. some ground conductive contacts 420 are shown as white circles illustrating individual connections where a single conductive contact on a qubit die is connected to a single conductive contacts on the package substrate. While FIG. 4A illustrates an example where a single preform 330 is used to connect multiple ground conductive contacts, in other embodiments, a single preform 330 may be used to connect multiple signal conductive contacts, if the same signal is to be provided to different conductive contacts.

FIG. 4B illustrates an exemplary top view of a physical layout 400B of conductive contacts 420, 422 as described above, where preforms 330-1 and 330-2 of different shapes may be used.

In general, preforms 330 may be of any shape suitable for a particular quantum circuit and for a particular connectivity that is desired. FIGS. 4C, 4D, and 4E illustrate further exemplary top views of physical layouts 400C, 400D, and 400E, respectively, each indicating a plurality of preforms 330. The physical layouts shown in FIGS. 4C-4E use black circles to illustrate signal conductive contacts, e.g. the conductive contacts 422 described above, and do not specifically illustrate ground conductive contacts, e.g. the conductive contacts 420 described above, but at least some of the preforms 330 shown in FIGS. 4C-4E may be used to connect the ground conductive contacts at a first face of a qubit die to corresponding conductive contacts at a second face of a package substrate, as described above.

Similarly, in general, preforms 340 may be of any shape suitable for providing desired mechanical support for a qubit die. FIG. 4C illustrates an exemplary implementation of four preforms 340 provided at the corners of a qubit die. However, any other geometries and locations for one or more preforms 340 used in the package 300 are possible and within the scope of the present disclosure. While FIGS. 4A, 4B, 4D, and 4E do not illustrate any of the preforms 340, in various embodiments, the physical layouts shown in these FIGS. may also include one or more preforms 340.

Described above are embodiments where a single preform 330 may be used to electrically connect more than one individual conductive contacts at a first face 312 of a qubit die 310 to one or more corresponding conductive contacts at an opposing face of a package substrate. Such embodiments may be particularly useful when using preforms to couple qubit dies with existing multiple conductive contacts to package substrates.

In other embodiments, the conductive contacts themselves on at least the first face of a qubit die, as well as possibly on the opposing face of a package substrate may be changed in shape so that they extend over larger distances, conformal to the shape of the preforms used to couple them. For example, the physical layouts shown in FIGS. 4C-4E may be seen as examples of how ground conductive contacts may be implemented at a first face of a qubit die. In other words, each of the grey areas shown in these FIGS. may be seen as an example of a single conductive contact at a first face of a qubit die such as the qubit die 310. Furthermore, each of the grey areas labeled with a reference numeral "330" shown in these FIGS. may be seen as an example of a single conductive contact at a second face of a package substrate such as the package substrate 320. Thus, at least one conductive contact may be implemented as a line provided in the plane of the corresponding face, e.g. the first face 312 of the qubit die 310 or the second face 324 of the package substrate 320, the line including at least one curved portion, as shown in FIGS. 4C-4E. For example, the curved portion may be used to implement a single ground conductive contact to at least partially enclose a corresponding signal conductive contact, as shown in FIGS. 4C-4E. In such embodiments, the preforms 330 may have substantially the same shapes as the conductive contacts on the first face of the qubit die 310 or/and as the conductive contacts on the second face of the package substrate 320.

Fabricating Qubit Device Packages Using Preforms

Qubit device packages where one or more preforms as described herein are used to couple one or more conductive contacts on one face of a qubit die with one or more conductive contacts on an opposing face of a package substrate, or/and to provide mechanical support for a qubit die without providing electrical coupling, may be manufactured using any suitable techniques. For example, FIG. 5 is a flow diagram of an example method 500 of manufacturing such packages in accordance with some embodiments of the present disclosure. Although the operations of the method 500 are illustrated once each and in a particular order, the operations may be performed in any suitable order and repeated as desired. For example, one or more operations may be performed in parallel to manufacture multiple qubit device packages substantially simultaneously. In another example, the operations may be performed in a different order to reflect the structure of a qubit device package in which a package substrate coupled to a qubit die using one or more preforms as described herein will be included. In addition, the manufacturing method 500 may include other operations, not specifically shown in FIG. 5, such as e.g. various cleaning operations as known in the art. For example, in some embodiments, any portions of the qubit device package, the qubit die, or the package substrate may be cleaned prior to, during, or/and after any of the processes of the method 500 described herein, e.g. to remove surface-bound organic and metallic contaminants, as well as sub-surface contamination. In some embodiments, cleaning may be carried out using e.g. chemical solutions (such as organic solvents or specialized cleaners), while the metal oxides may be removed using acid solutions (e.g., a hydrochloric acid). In another example, the method 500 may further include other manufacturing operations related to fabrication of other components of a qubit device package, also not specifically shown in FIG. 5.

At 502, a qubit die with a quantum circuit thereon and a package substrate with a suitable metallization stack may be provided. The qubit die provided at 502 may take the form of any of the embodiments of the qubit dies disclosed herein, e.g., any of the embodiments discussed herein with reference to the qubit die 310. The package substrate provided at 502 may take the form of any of the embodiments of the package substrates disclosed herein, e.g., any of the embodiments discussed herein with reference to the package substrate 320.

At 504 and 506, which may be performed in any order, a first face of a preform (or multiple such preforms) is attached to one or more conductive contacts at a face of the qubit die and a second face of the preform is attached to one or more conductive contacts at a face of the package substrate. Attaching a preform to conductive contacts of the qubit die and the package substrate would realize electrical connectivity between the die and the package substrate, as discussed above. The preform attached to the qubit die and the package substrate at 504, 506 to realize electrical connections may take the form of any of the embodiments of the preforms used in packages disclosed herein, e.g., any of the embodiments discussed herein with reference to the preforms 330 and the package 300. Besides, or instead of, attaching preforms to realize electrical connections, processes 504 and 506 may involve attaching one or more preforms to a qubit die and a package substrate in order to provide mechanical stability or support, as also discussed above. The preform attached to the qubit die and the package substrate at 504, 506 to provide mechanical stability and support may take the form of any of the embodiments of the preforms used in packages disclosed herein, e.g., any of the embodiments discussed herein with reference to the preforms 340 and the package 300. In some embodiments, a preform may be attached to each of the qubit die and the package substrate using, but not limited to, thermocompression bonding, reflow process, or epoxy dispense and cure process.

Exemplary Qubit Devices

Quantum circuit assemblies, structures, and packages as described above may be included in any kind of qubit devices or quantum processing devices/structures. Some examples of such devices/structures are illustrated in FIGS. 6A-6B, 7, and 8.

Figure 6B:
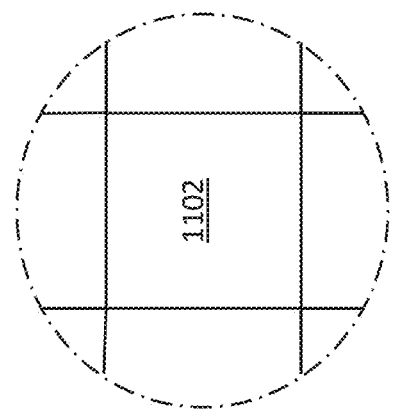
FIGS. 6A and 6B are top views of a wafer and dies that may include any of the qubit devices disclosed herein, in accordance with various embodiments of the present disclosure.
Figure 6A:
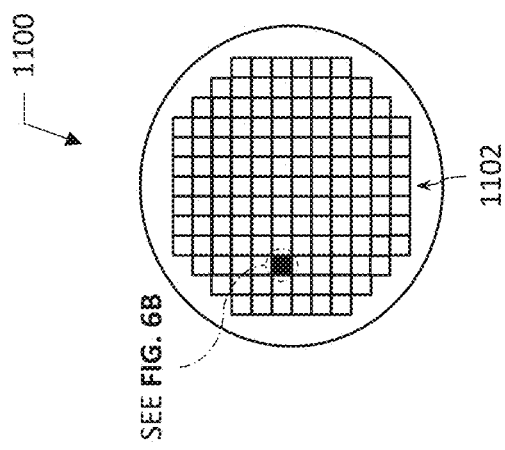

FIGS. 6A-6B are top views of a wafer 1100 and dies 1102 that may be formed from the wafer 1100, according to some embodiments of the present disclosure. The dies 1102 may include any of the qubit devices disclosed herein, e.g., a qubit device of the quantum circuits 100 or 200, any combinations of those circuits, or any further variations of those circuits as described above. The wafer 1100 may include semiconductor material and may include one or more dies 1102 having conventional and quantum circuit device elements formed on a surface of the wafer 1100. Each of the dies 1102 may be a repeating unit of a semiconductor product that includes any suitable conventional and/or quantum circuit qubit device. After the fabrication of the semiconductor product is complete, the wafer 1100 may undergo a singulation process in which each of the dies 1102 is separated from one another to provide discrete "chips" of the semiconductor product. A die 1102 may include one or more quantum circuits 100 or 200 or any further variations or combinations of those circuits, including any supporting conductive circuitry to route electrical signals within the quantum circuits, as well as any other IC components. In some embodiments, the wafer 1100 or the die 1102 may include a memory device (e.g., a static random access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG. 8) or other logic that is configured to store information in the memory devices or execute instructions stored in the memory array.

Figure 7:
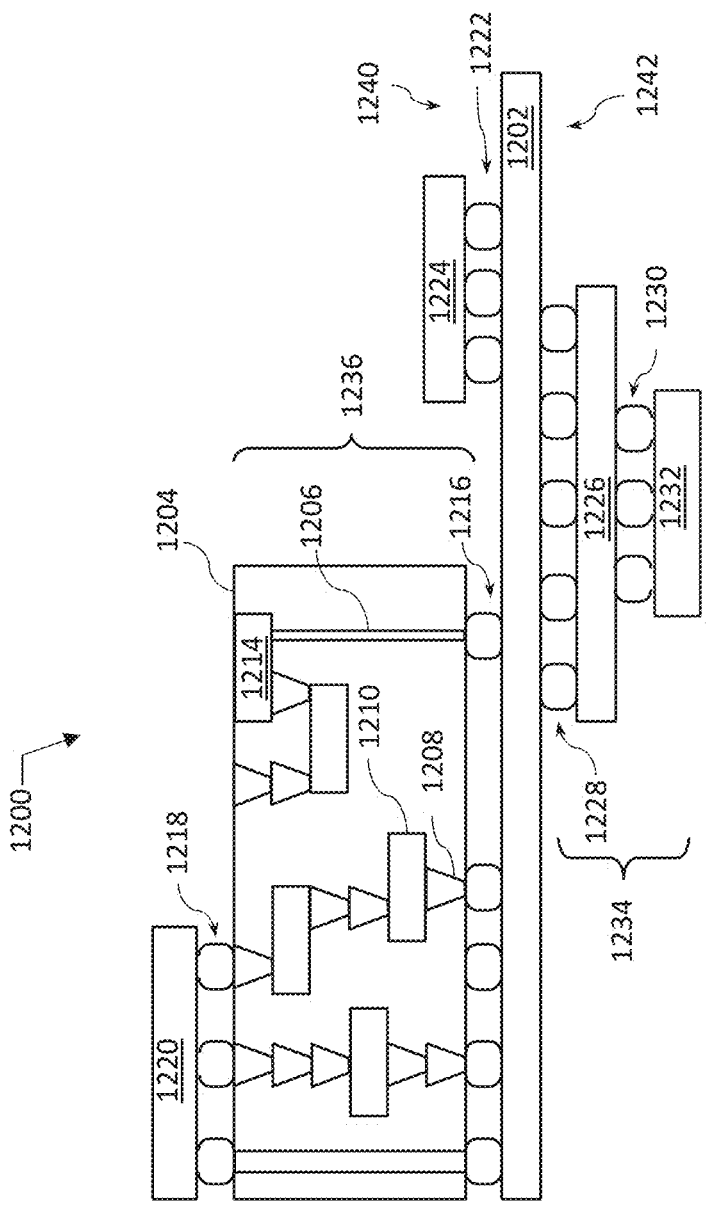
FIG. 7 is a cross-sectional side view of a device assembly that may include any of the qubit device packages disclosed herein, in accordance with various embodiments of the present disclosure.

FIG. 7 is a cross-sectional side view of a device assembly 1200 that may include any of the qubit device packages disclosed herein. The device assembly 1200 includes a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other embodiments, the circuit board 1202 may be a package substrate or flexible board.

The IC device assembly 1200 illustrated in FIG. 7 may include a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 7), male and female portions of a socket, an adhesive, an underfill material, and/or any other suitable electrical and/or mechanical coupling structure.

The package-on-interposer structure 1236 may include a package 1220 coupled to an interposer 1204 by coupling components 1218. The package 1220 may be a quantum circuit device package as described herein, e.g. a package including any of the qubit devices disclosed herein, e.g., a qubit device of the quantum circuits 100 or 200, any combinations of those circuits, or any further variations of those circuits as described above, or may be a conventional IC package, for example. In some embodiments, the package 1220 may be a die, e.g. a qubit die, e.g. any embodiment of a qubit die 310 as described herein. In some embodiments, the coupling components 1218 may take any suitable form for the application, such as the forms discussed above with reference to the coupling components 1216. In other embodiments, at least some of the coupling components 1218 may be implemented as any of the preforms described herein, e.g. as preforms 330, 340, configured to electrically and/or mechanically couple the package 1220 to the interposer 1204. Although a single package 1220 is shown in FIG. 7, multiple packages may be coupled to the interposer 1204; indeed, additional interposers may be coupled to the interposer 1204. The interposer 1204 may provide an intervening substrate used to bridge the circuit board 1202 and the package 1220. Generally, the interposer 1204 may spread a connection to a wider pitch or reroute a connection to a different connection. For example, the interposer 1204 may couple the package 1220 to a ball grid array (BGA) of the coupling components 1216 for coupling to the circuit board 1202. In the embodiment illustrated in FIG. 7, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220. The package 1224 may be a package including one or more quantum circuits with qubits as described herein or may be a conventional IC package, for example. In some embodiments, the package 1224 may take the form of any of the embodiments of the packages with any of the qubit devices disclosed herein, e.g., a qubit device of the quantum circuits 100 or 200, any combinations of those circuits, or any further variations of those circuits as described above. The package 1224 may take the form of any of the embodiments of the package 1220 discussed above and the coupling components 1222 may take form of any of the embodiments of the coupling components 1218 discussed above.

The device assembly 1200 illustrated in FIG. 7 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216, 1218 discussed above, and the packages 1226 and 1232 may take the form of any of the embodiments of the package 1220 discussed above. Each of the packages 1226 and 1232 may be a qubit device package as described herein or may be a conventional IC package, for example. In some embodiments, one or both of the packages 1226 and 1232 may take the form of any of the embodiments of the packages with any of the qubit devices disclosed herein, e.g., a qubit device of the quantum circuits 100 or 200, any combinations of those circuits, or any further variations of those circuits as described above.

In some embodiments, any one of the packages 1220, 1224, 1226, or 1232 may include any of the qubit device packages 300 described herein. In other embodiments, any one of the packages 1220, 1224, 1226, or 1232 may include only the qubit die 310 as described herein and be coupled to a corresponding further IC component such as e.g. interposer, circuit board, etc., which may be implemented as the package substrate 320 described herein, using preforms as described herein, e.g. any embodiments of the preforms 330, 340 described above. For example, the qubit die 310 implemented in the package 1220 could be coupled to the interposer 1204 representing the package substrate 320 described herein, with at least some of the coupling components 1218 being analogous to the preforms 330 or/and preforms 340 described herein. In another example, the qubit die 310 implemented in the package 1224 could be coupled to the circuit board 1202 representing the package substrate 320 described herein, with at least some of the coupling components 1222 being analogous to the preforms 330 or/and preforms 340 described herein. In yet another example, the qubit die 310 implemented in the package 1232 could be coupled to the package 1226 representing the package substrate 320 described herein, with at least some of the coupling components 1230 being analogous to the preforms 330 or/and preforms 340 described herein.

Figure 8:
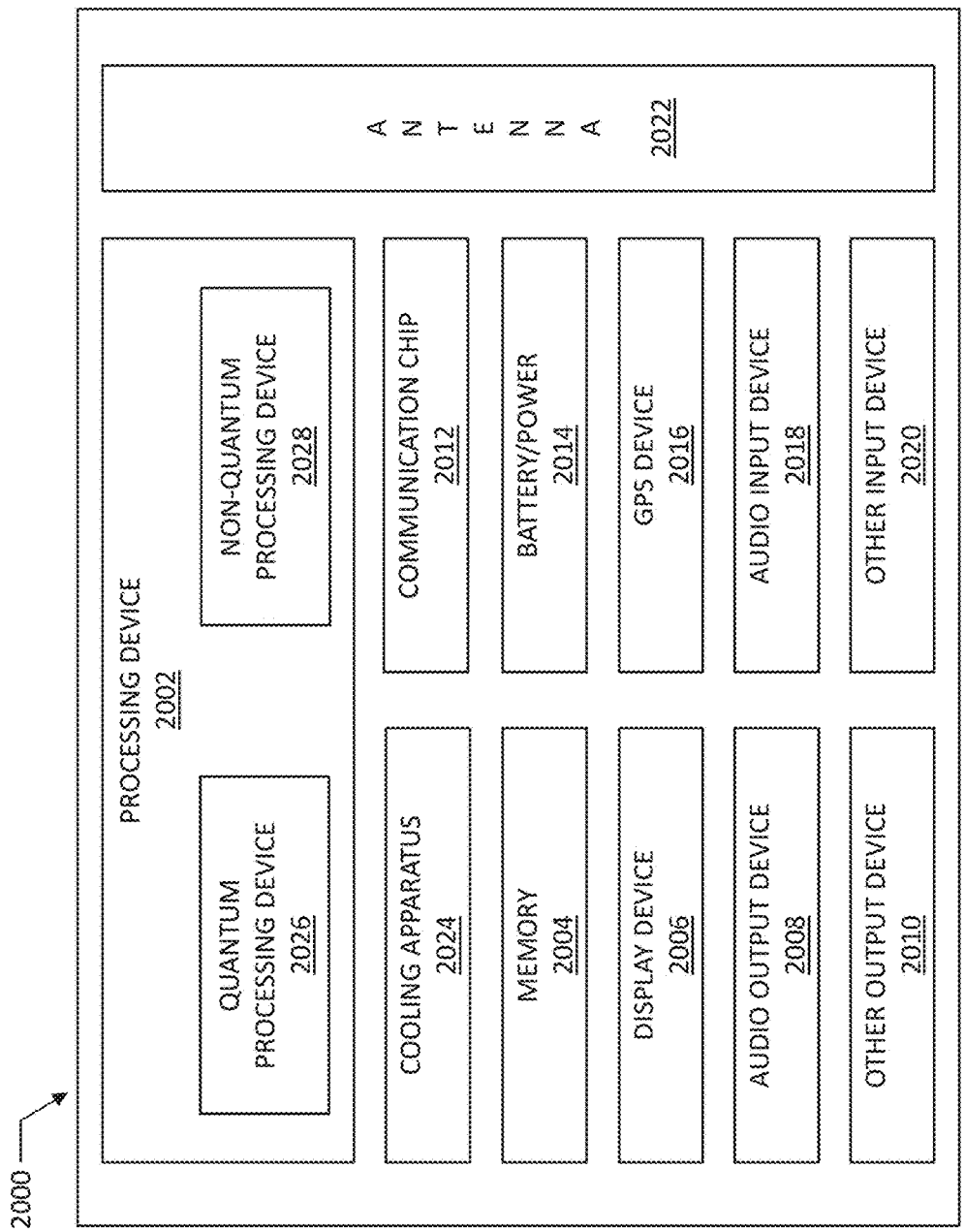
FIG. 8 is a block diagram of an example quantum computing device that may include any of the qubit device packages disclosed herein, in accordance with various embodiments of the present disclosure.

FIG. 8 is a block diagram of an exemplary quantum computing device 2000 that may include any of the qubit device packages disclosed herein. A number of components are illustrated in FIG. 8 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuits with any of the quantum circuit assemblies described herein. In some embodiments, various ones of these components may be fabricated onto a single system-on-a-chip (SoC) die. Additionally, in various embodiments, the quantum computing device 2000 may not include one or more of the components illustrated in FIG. 8, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008, but may include audio input or output device interface circuitry (e.g., connectors and supporting circuitry) to which an audio input device 2018 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the qubit device packages using preforms as disclosed herein, e.g. any embodiments of the packages 300 described herein, portions of which may be included in any of the dies as shown in FIGS. 6A and 6B, or/and in a device assembly as shown in FIG. 7, and may perform data processing by performing operations on the qubits that may be generated in the quantum circuits implemented in the qubit dies of such packages, e.g. in the qubit die 310, and monitoring the result of those operations. For example, as discussed above, different qubits may be allowed to interact, the quantum states of different qubits may be set or transformed, and the quantum states of different qubits may be read, some of which operations are discussed above. The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-MRAM).

The quantum computing device 2000 may include a cooling apparatus 2024. The cooling apparatus 2024 may maintain the quantum processing device 2026, in particular the quantum circuits as described herein, at a predetermined low temperature during operation to avoid qubit decoherence and to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2024 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Select Examples

The following paragraphs provide some select examples of various ones of the embodiments disclosed herein.

Example 1 provides a qubit device package that may include a qubit die, a package substrate, and an interconnect structure. The qubit device includes one or more qubit devices and has a first face and an opposing second face, and where the first face of the qubit die includes a plurality of conductive contacts. The package substrate has a first face and an opposing second face, where the second face of the package substrate includes a plurality of conductive contacts. The interconnect structure is configured to couple two or more of the plurality of conductive contacts at the first face of the qubit die with associated two or more conductive contacts at the second face of the package substrate.

Example 2 provides the qubit device package according to Example 1, where the interconnect structure is a solder preform.

Example 3 provides the qubit device package according to Example 1, where the interconnect structure is an indium preform.

Example 4 provides the qubit device package according to Example 1, where the interconnect structure includes an electrically conductive material that is continuous between two or more of the plurality of conductive contacts at the first face of the qubit die and the associated two or more conductive contacts at the second face of the package substrate.

Example 5 provides the qubit device package according to Example 1, where the interconnect structure is a preform including an electrically conductive core material coated with a solder material.

Example 6 provides the qubit device package according to Example 5, where the electrically conductive core material includes copper.

Example 7 provides the qubit device package according to Examples 5 or 6, where the solder material includes indium. In other embodiments, the solder material may include bismuth, silver or gallium.

Example 8 provides the qubit device package according to any one of Examples 5-7, where the solder material has a melting point that is less than 180 degrees Celsius.

Example 9 provides the qubit device package according to Example 1, where the interconnect structure is a preform including an electrically non-conductive core material coated with a solder material.

Example 10 provides the qubit device package according to Example 9, where the solder material includes indium. In other embodiments, the solder material may include bismuth, silver or gallium.

Example 11 provides the qubit device package according to Examples 9 or 10, where the solder material has a melting point that is less than 180 degrees Celsius.

Example 12 provides the qubit device package according to any one of Examples 1-11, where an individual conductive contact of the plurality of conductive contacts at the first face of the qubit die or at the second face of the package substrate includes a metal defined pad. In some embodiments, each conductive contact of the plurality of conductive contacts at the first face of the qubit die and of the plurality of conductive contacts at the second face of the package substrate includes a metal defined pad.

Example 13 provides the qubit device package according to any one of Examples 1-11, where an individual conductive contact of the plurality of conductive contacts at the first face of the qubit die or at the second face of the package substrate includes a solder mask defined pad. In some embodiments, each conductive contact of the plurality of conductive contacts at the first face of the qubit die and of the plurality of conductive contacts at the second face of the package substrate includes a solder mask defined pad.

Example 14 provides the qubit device package according to any one of the preceding Examples, where the two or more of the plurality of conductive contacts are ground contacts (i.e. contacts for providing electrical connection of the qubit die to the ground potential or any reference potential).

Example 15 provides the qubit device package according to any one of the preceding Examples, where the package substrate is an interposer.

Example 16 provides the qubit device package according to any one of the preceding Examples, where the one or more qubit devices include one or more superconducting qubit devices.

Example 17 provides the qubit device package according to Example 16, where the one or more superconducting qubit devices include at least one resonator at the first face of the qubit die (i.e. the qubit device package may be a flip-chip package where at least one resonator is facing the package substrate).

Example 18 provides a method of manufacturing a qubit device package, the method including attaching a first face of an interconnect structure to two or more of a plurality of conductive contacts at a first face of a qubit die, where the qubit die includes one or more qubit devices; and attaching a second face of the interconnect structure, the second face opposing the first face of the interconnect structure, to two or more of a plurality of conductive contacts at a second face of a package substrate.

Example 19 provides the method according to Example 18, where the interconnect structure includes an electrically conductive material that is continuous between two or more of the plurality of conductive contacts at the first face of the qubit die and the associated two or more conductive contacts at the second face of the package substrate.

Example 20 provides the method according to Examples 18 or 19, where the interconnect structure is a preform.

Example 21 provides the method according to any one of Examples 18-20, further including providing the qubit die having the first face and an opposing second face.

Example 22 provides the method according to any one of Examples 18-21, further including providing the package substrate having a first face opposing the second face.

In various further Examples, the method of manufacturing the qubit device package according to any one of Examples 18-22 may further include processes for manufacturing the qubit device package having features according to any one of the preceding Examples, e.g. any one of Examples 1-17.

Example 23 provides a qubit device package that may include a qubit die, a package substrate, and an interconnect structure. The qubit die includes one or more qubit devices, has a first face and an opposing second face, and the first face of the qubit die includes a conductive contact. The package substrate has a first face and an opposing second face, where the second face of the package substrate includes a conductive contact. The interconnect structure is configured to couple the conductive contact at the first face of the qubit die with the conductive contact at the second face of the package substrate, where the conductive contact at the first face of the qubit die is shaped as a line provided in a plane of the first face of the qubit die, the line including at least one curved portion.

Example 24 provides the qubit device package according to Example 23, where a shape of the conductive contact at the second face of the package substrate is conformal to a shape of the conductive contact at the first face of the qubit die.

Example 25 provides the qubit device package according to Example 23, where the conductive contact at the second face of the package substrate is shaped as a line provided in a plane of the second face of the package substrate, the line including at least one curved portion.

The device package according to any one of Examples 23-25, where the conductive contact at the first face of the qubit die is a ground conductive contact, the first face of the qubit die further includes a signal conductive contact, and the at least one curved portion of the ground conductive contact at the first face of the qubit die includes a portion at least partially enclosing the signal conductive contact.

In further Examples, the shape of the ground conductive contact at the second face of the package substrate may also be such that said ground conductive contact includes at least a portion at least partially enclosing a signal conductive contact at the second face of the package substrate.

Example 27 provides the qubit device package according to any one of Examples 23-26, where the interconnect structure is a solder preform.

Example 28 provides the qubit device package according to any one of Examples 23-27, where the interconnect structure is an indium preform.

Example 29 provides the qubit device package according to any one of Examples 23-28, where the interconnect structure is a preform including an electrically conductive core material coated with a solder material.

Example 30 provides the qubit device package according to any one of Examples 23-28, where the interconnect structure is a preform including an electrically non-conductive core material coated with a solder material.

Example 31 provides the qubit device package according to Examples 29 or 30, where the solder material includes indium. In other embodiments, the solder material may include bismuth, silver or gallium.

Example 32 provides the qubit device package according to any one of Examples 29-31, where the solder material has a melting point that is less than 180 degrees Celsius.

Example 33 provides the qubit device package according to any one of Examples 28-32, where the conductive contact at the first face of the qubit die or the conductive contact at the second face of the package substrate is a metal defined pad.

Example 34 provides the qubit device package according to any one of Examples 28-32, where the conductive contact at the first face of the qubit die or the conductive contact at the second face of the package substrate is a solder mask defined pad.

Example 35 provides the qubit device package according to any one of Examples 23-34, where the package substrate is an interposer.

Example 36 provides a method of manufacturing a qubit device package, the method including attaching a first face of an interconnect structure to a conductive contact at a first face of a qubit die, where the qubit die includes one or more qubit devices; and attaching a second face of the interconnect structure, the second face opposing the first face of the interconnect structure, to a conductive contact at a second face of a package substrate, where the conductive contact at the first face of the qubit die is shaped as a line provided in a plane of the first face of the qubit die, the line including at least one curved portion.

Example 37 provides the method according to Example 36, where the interconnect structure is a preform.

Example 38 provides the method according to Examples 36 or 37, where a shape of the conductive contact at the second face of the package substrate is conformal to a shape of the conductive contact at the first face of the qubit die.

Example 39 provides the method according to any one of Examples 36-38, where the conductive contact at the first face of the qubit die is a ground conductive contact, the first face of the qubit die further includes a signal conductive contact, and the at least one curved portion of the ground conductive contact at the first face of the qubit die includes a portion at least partially enclosing the signal conductive contact.

In further Examples, the shape of the ground conductive contact at the second face of the package substrate may also be such that said ground conductive contact includes at least a portion at least partially enclosing a signal conductive contact at the second face of the package substrate.

Example 40 provides the method according to any one of Examples 36-39, further including providing the qubit die having the first face and an opposing second face.

Example 41 provides the method according to any one of Examples 36-40, further including providing the package substrate having a first face opposing the second face.

In various further Examples, the method of manufacturing the qubit device package according to any one of Examples 36-41 may further include processes for manufacturing the qubit device package having features according to any one of Examples 23-35.

Example 42 provides a quantum computing device that includes a quantum processing device including a qubit device package that includes a plurality of qubit devices. The quantum computing device further includes a memory device configured to store data generated by the plurality of qubit devices during operation of the quantum processing device, where the qubit device package is the qubit device package according to any one of Examples 1-17 or the qubit device package according to any one of Examples 23-35.

Example 43 provides the quantum computing device according to Example 42, further including a cooling apparatus configured to maintain a temperature of at least portions of the quantum processing device below 5 degrees Kelvin.

Example 44 provides the quantum computing device according to Examples 42 or 43, where the memory device is further configured to store instructions for a quantum computing algorithm to be executed by the quantum processing device.

Example 45 provides the quantum computing device according to any one of Examples 42-44, further including a non-quantum processing device coupled to the quantum processing device.

Example 46 provides the quantum computing device according to Example 45, where the non-quantum processing device is coupled to the quantum processing device at least partially via the package substrate and configured to control signals applied to the plurality of qubit devices.

In various further Examples, the qubit device package of the quantum processing device of the quantum computing device according to any one of Examples 42-46 may be implemented as the qubit device package according to any one of the preceding Examples, e.g. any one of Examples 1-17 or any one of Examples 23-35.

The invention claimed is:

1. A qubit device package, comprising:
   a qubit die having a first face and an opposing second face, where the qubit die includes one or more qubit devices, and where the first face of the qubit die includes a plurality of conductive contacts;
   a package substrate having a first face and an opposing second face, where the second face of the package substrate includes a plurality of conductive contacts; and
   an interconnect structure, coupling two or more of the plurality of conductive contacts at the first face of the qubit die with associated two or more conductive contacts at the second face of the package substrate.

2. The qubit device package according to claim 1, wherein the interconnect structure is a solder preform.

3. The qubit device package according to claim 1, wherein the interconnect structure is an indium preform.

4. The qubit device package according to claim 1, wherein the interconnect structure includes an electrically conductive material that is continuous between two or more of the plurality of conductive contacts at the first face of the qubit die and the associated two or more conductive contacts at the second face of the package substrate.

5. The qubit device package according to claim 1, wherein the interconnect structure is a preform comprising an electrically conductive core material coated with a solder material.

6. The qubit device package according to claim 5, wherein the electrically conductive core material includes copper or indium.

7. The qubit device package according to claim 5, wherein the solder material has a melting point that is less than 180 degrees Celsius.

8. The qubit device package according to claim 1, wherein the interconnect structure is a preform comprising an electrically non-conductive core material coated with a solder material.

9. The qubit device package according to claim 8, wherein the solder material includes indium.

10. The qubit device package according to claim 8, wherein the solder material has a melting point that is less than 180 degrees Celsius.

11. The qubit device package according to claim 1, wherein an individual conductive contact of the plurality of conductive contacts at the first face of the qubit die or at the second face of the package substrate includes a metal defined pad.

12. The qubit device package according to claim 1, wherein an individual conductive contact of the plurality of conductive contacts at the first face of the qubit die or at the second face of the package substrate includes a solder mask defined pad.

13. The qubit device package according to claim 1, wherein the two or more of the plurality of conductive contacts are ground contacts.

14. The qubit device package according to claim 1, wherein the package substrate is an interposer.

15. The qubit device package according to claim 1, wherein the one or more qubit devices include one or more superconducting qubit devices.

16. The qubit device package according to claim 15, wherein the one or more superconducting qubit devices include at least one resonator at the first face of the qubit die.

17. A qubit device package, comprising:
a qubit die having a first face and an opposing second face, where the qubit die includes one or more qubit devices, and where the first face of the qubit die includes a conductive contact;
a package substrate having a first face and an opposing second face, where the second face of the package substrate includes a conductive contact; and
an interconnect structure, coupling the conductive contact at the first face of the qubit die with the conductive contact at the second face of the package substrate,
where the conductive contact at the first face of the qubit die is shaped as a line provided in a plane of the first face of the qubit die, the line including at least one curved portion.

18. The qubit device package according to claim 17, where a shape of the conductive contact at the second face of the package substrate is conformal to a shape of the conductive contact at the first face of the qubit die.

19. The qubit device package according to claim 17, where the conductive contact at the second face of the package substrate is shaped as a line provided in a plane of the second face of the package substrate, the line including at least one curved portion.

20. The device package according to claim 17, wherein:
the conductive contact at the first face of the qubit die is a ground conductive contact,
the first face of the qubit die further includes a signal conductive contact, and
the at least one curved portion of the ground conductive contact at the first face of the qubit die includes a portion at least partially enclosing the signal conductive contact.

* * * * *